United States Patent
Takahashi

(10) Patent No.: US 12,211,861 B2
(45) Date of Patent: Jan. 28, 2025

(54) LOW NOISE VERTICAL GATE DEVICE STRUCTURE

(71) Applicant: Taiwan Semiconductor Manufacturing Company, Ltd., Hsin-Chu (TW)

(72) Inventor: Seiji Takahashi, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 821 days.

(21) Appl. No.: 17/350,380

(22) Filed: Jun. 17, 2021

(65) Prior Publication Data

US 2021/0313365 A1  Oct. 7, 2021

Related U.S. Application Data

(62) Division of application No. 16/547,739, filed on Aug. 22, 2019, now Pat. No. 11,069,728.

(60) Provisional application No. 62/806,161, filed on Feb. 15, 2019.

(51) Int. Cl.
H01L 27/146 (2006.01)

(52) U.S. Cl.
CPC .. H01L 27/14614 (2013.01); H01L 27/14603 (2013.01); H01L 27/1461 (2013.01); H01L 27/14616 (2013.01); H01L 27/14645 (2013.01); H01L 27/14689 (2013.01)

(58) Field of Classification Search
CPC ......... H01L 27/14806; H01L 27/14814; H01L 29/4236; H01L 29/42372; H01L 29/42324; H01L 29/42376; H01L 29/4238
See application file for complete search history.

(56) References Cited

U.S. PATENT DOCUMENTS

| | | | |
|---|---|---|---|
| 9,647,016 B2 | 5/2017 | Oh et al. | |
| 2004/0099886 A1 | 5/2004 | Rhodes et al. | |
| 2011/0018037 A1* | 1/2011 | Ohri | H01L 27/14612 257/E27.15 |
| 2013/0221410 A1* | 8/2013 | Ahn | H01L 27/14612 257/225 |
| 2016/0013240 A1* | 1/2016 | Jung | H01L 27/14614 257/292 |
| 2016/0086984 A1 | 3/2016 | Wang et al. | |

(Continued)

OTHER PUBLICATIONS

Non-Final Office Action dated Oct. 6, 2020 for U.S. Appl. No. 16/547,739.

(Continued)

*Primary Examiner* — Alia Sabur
(74) *Attorney, Agent, or Firm* — Eschweiler & Potashnik, LLC

(57) ABSTRACT

Various embodiments of the present disclosure are directed towards a method for forming a pixel sensor. The method comprises forming a photodetector in a substrate. The substrate is patterned to define an opening above the photodetector. A gate electrode is formed within the opening, where the gate electrode has a top conductive body overlying a bottom conductive body. A first segment of a sidewall of the top conductive body contacts the bottom conductive body. A floating diffusion node is formed in the substrate laterally adjacent to the gate electrode. A second segment of the sidewall of the top conductive body overlies the floating diffusion node.

20 Claims, 21 Drawing Sheets

(56) References Cited

U.S. PATENT DOCUMENTS

2017/0207263 A1* 7/2017 Park ................. H01L 27/14614
2017/0207264 A1   7/2017 Oh et al.
2018/0102392 A1   4/2018 Hwang
2020/0111821 A1* 4/2020 Hong ................ H01L 27/14689

OTHER PUBLICATIONS

Notice of Allowance dated Mar. 19, 2021 for U.S. Appl. No. 16/547,739.

* cited by examiner

LOW NOISE VERTICAL GATE DEVICE STRUCTURE

REFERENCE TO RELATED APPLICATIONS

This application is a Divisional of U.S. application Ser. No. 16/547,739, filed on Aug. 22, 2019, which claims the benefit of U.S. Provisional Application No. 62/806,161, filed on Feb. 15, 2019. The contents of the above-referenced patent applications are hereby incorporated by reference in their entirety.

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CISs). Compared to CCD image sensors, CISs are favored due to, among other things, low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
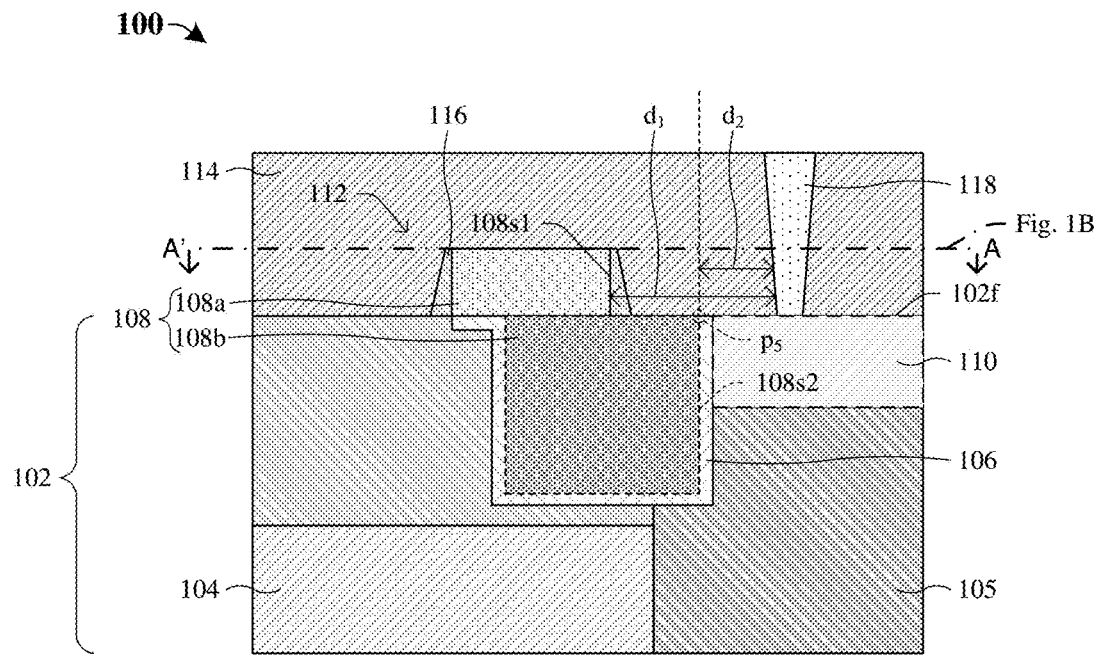
FIGS. 1A-1C illustrate various views of a pixel sensor having a vertical transfer transistor with low noise.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) have an array of pixel sensors. A pixel sensor records incident radiation using a photodetector, and facilitates digital readout of the recording with a plurality of pixel devices (e.g., a transfer transistor, a reset transistor, a source follower transistor, and/or a row-select transistor). Some pixel sensors comprise an array of photodetectors (e.g., a 2×2 photodetector pixel sensor). In such pixel sensors, a plurality of photodetectors is disposed in a semiconductor substrate. A vertical transfer transistor is disposed over each photodetector, and a transfer gate electrode of each vertical transfer transistor extends from above a top surface of the semiconductor substrate to a point below the top surface of the semiconductor substrate (e.g., directly above an upper surface of a respective one of the photodetectors). Further, the photodetectors share a common floating diffusion node. The common floating diffusion node may be a region of the semiconductor substrate in which the photodetectors may respectively transfer accumulated charge during readout. A conductive contact is disposed over the floating diffusion node, such that the transferred accumulated charge may be output to overlying metal layers (e.g., conductive wires and/or vias) and/or other pixel devices (e.g., a source follower transistor and/or a row-select transistor) for digital readout.

Challenges with the above pixel sensor include parasitic capacitance between a transfer gate electrode and the conductive contact, and "leakage" (i.e., a flow of current) between the transfer gate electrode and the floating diffusion node. One parasitic capacitance source is due to the location (and/or proximity) of the transfer gate electrode in relation to the conductive contact. For example, the transfer gate electrode has a top conductive body overlying the top surface of the semiconductor substrate and a bottom conductive body underlying the top surface of the semiconductor substrate. The top conductive body of the transfer gate electrode may overlie the floating diffusion node, and is laterally separated from the conductive contact by a first lateral distance. The first lateral distance is substantially small (e.g., 1-10 nanometers), resulting in a parasitic capacitance between the top conductive body of the transfer gate electrode and the conductive contact. The parasitic capacitance may lower a gain conversion of the digital readout of the accumulated charge and/or increase a noise in the digital readout. This, in part, may cause fixed-pattern noise (FPN) in images produced from the pixel sensor.

Further, by virtue of the shape of the transfer gate electrode, a high electric field accumulates at a corner of the transfer gate electrode where the top conductive body and the bottom conductive body meet. The corner is separated from the floating diffusion node by an underlying transfer gate dielectric. However, due to a doping concentration (e.g., N-type) of the floating diffusion node and the high electric field at the corner of the transfer gate electrode, "leakage" occurs between the transfer gate electrode and the floating diffusion node. This "leakage" may further increase the FPN in images produced from the pixel sensor.

In some embodiments, the present disclosure relates to a vertical transfer transistor structure in a pixel sensor that provides reduced FPN and/or increased gain conversion of the digital readout. For example, the top conductive body of the transfer gate electrode is laterally separated from the floating diffusion node by a second lateral distance. The second lateral distance is substantially large (e.g., 20-100 nanometers), thereby mitigating and/or eliminating a parasitic capacitance between the top conductive body of the transfer gate electrode and the conductive contact. This, in part, may increase a gain conversion of the digital readout of the pixel sensor and/or decrease a noise in the digital readout, thereby reducing FPN in images produced from the pixel sensor. Further, a corner of the transfer gate electrode adjacent to the floating diffusion node may be rounded by an angle (e.g., 30°-60°), thereby mitigating an accumulation of an electric field at the rounded corner of the transfer gate electrode. The rounded corner of the transfer gate electrode may further mitigate and/or eliminate a "leakage" between the transfer gate electrode and the floating diffusion node, thereby further decreasing the FPN in images produced from the pixel sensor.

Figure 1B:
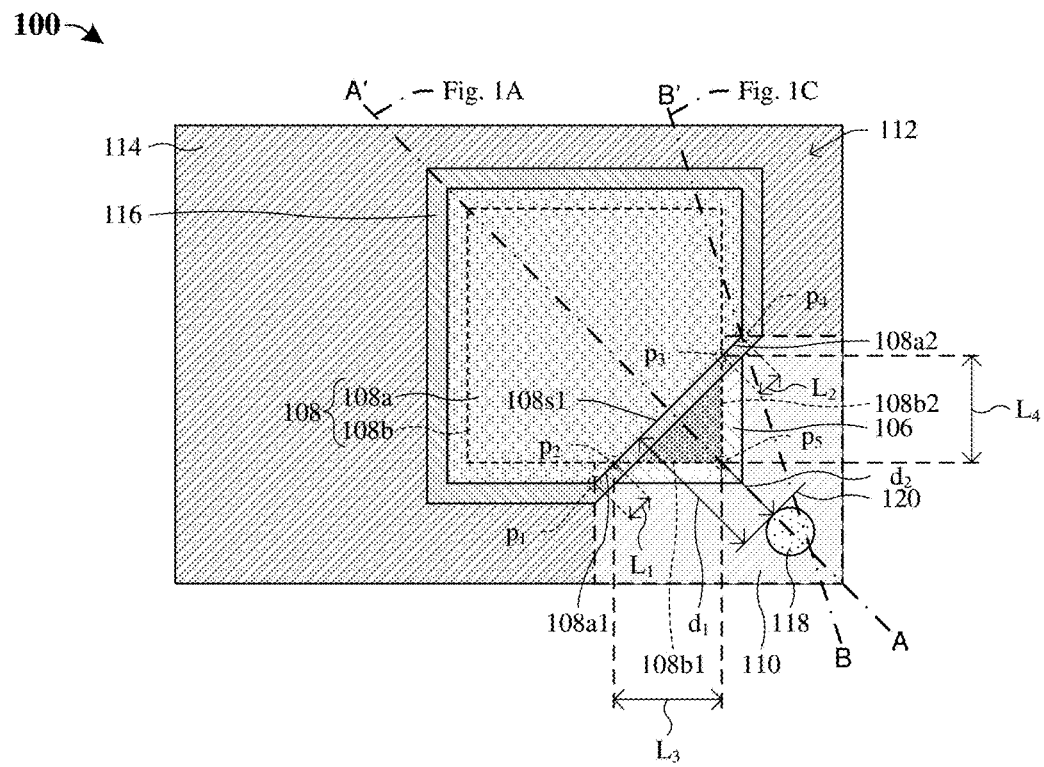
Figure 1C:
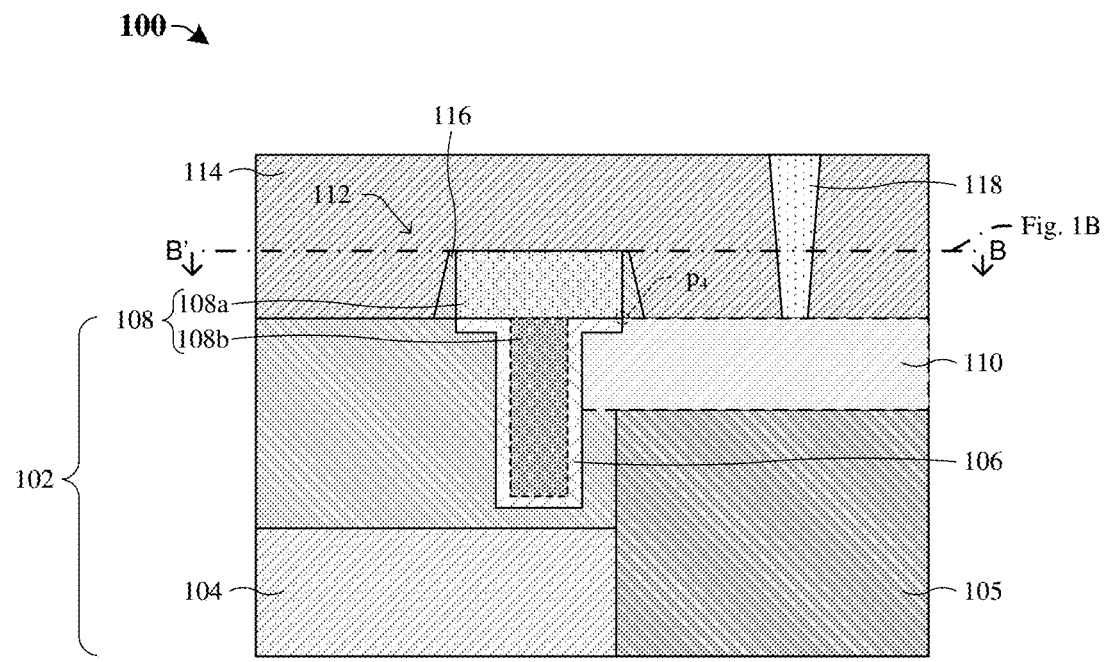

FIGS. 1A-1C illustrate various views of some embodiments of a pixel sensor 100 comprising a vertical transfer transistor 112 overlying a photodetector 104. FIG. 1A illustrates a cross-sectional view of the pixel sensor 100. FIG. 1B illustrates a top view of the pixel sensor 100 taken along line A-A' of FIG. 1A. FIG. 1C illustrates another cross-sectional view of the pixel sensor 100 taken along line B-B' of FIG. 1B.

As shown in FIG. 1A, the pixel sensor 100 comprises a pixel sensor well region 105 disposed in a substrate 102. In some embodiments, the substrate 102 comprises any type of semiconductor body (e.g., monocrystalline silicon/CMOS bulk, silicon-germanium (SiGe), silicon on insulator (SOI), etc.) and/or has a first doping type (e.g., p-type doping). The pixel sensor well region 105 is a region of the substrate 102 having the first doping type.

The photodetector 104 is disposed in the substrate 102. The photodetector 104 is configured to convert electromagnetic radiation (e.g., photons) into electric signals (i.e., to generate electron-hole pairs from the electromagnetic radiation). The photodetector 104 comprises a second doping type (e.g., n-type doping) opposite the first doping type. In some embodiments, the first doping type is n-type and the second doping type is p-type, or vice versa. A floating diffusion node 110 is disposed above the pixel sensor well region 105. The floating diffusion node 110 is a region of the substrate 102 having the second doping type (e.g., n-type).

A vertical transfer transistor 112 overlies a front side surface 102$f$ of the substrate 102. The vertical transfer transistor 112 is disposed between the floating diffusion node 110 and the photodetector 104. The vertical transfer transistor 112 may selectively form a conductive channel between the photodetector 104 and the floating diffusion node 110 to transfer accumulated charge in the photodetector 104 to the floating diffusion node 110. For example, the vertical transfer transistor 112 may form the conductive channel in the pixel sensor well region 105. The vertical transfer transistor 112 comprises a transfer gate electrode 108, a transfer gate dielectric 106, and a sidewall spacer 116. The transfer gate electrode 108 comprises a top conductive body 108$a$ and a bottom conductive body 108$b$. In some embodiments, a bottom surface of the top conductive body 108$a$ is substantially aligned with the front side surface 102$f$ of the substrate 102 and a top surface of the bottom conductive body 108$b$ is substantially aligned with the front side surface 102$f$ of the substrate 102. In further embodiments, the transfer gate electrode 108 is a single continuous material, such that the top conductive body 108$a$ and the bottom conductive body 108$b$ comprise a same continuous material. In some embodiments, the same continuous material may, for example, be or comprise metal, doped polysilicon, or the like. In yet further embodiments, the top conductive body 108$a$ comprises a material different from the bottom conductive body 108$b$.

A first inter-level dielectric (ILD) layer 114 is disposed over the front side surface 102$f$ of the substrate 102. A contact 118 extends from an upper surface of the first ILD layer 114 to the floating diffusion node 110. The contact 118 is configured to electrically couple the floating diffusion node 110 to overlying metal layers and/or other semiconductor devices.

A sidewall 108$s$1 of the top conductive body 108$a$ is laterally offset from the contact 118 by a first distance $d_1$. A sidewall 108$s$2 of the bottom conductive body 108$b$ is laterally offset the contact 118 by a second distance $d_2$. In some embodiments, the first distance $d_1$ is the shortest distance between the top conductive body 108$a$ and the contact 118, and the second distance $d_2$ is the shortest distance between the bottom conductive body 108$b$ and the contact 118. In some embodiments, the first distance $d_1$ is within a range of approximately 40 to 200 nanometers, and/or the second distance $d_2$ is within a range of approximately 20 to 100 nanometers. The first distance $d_1$ is, for example, greater than the second distance $d_2$, such that the sidewall 108$s$1 is laterally offset from the sidewall 108$s$2 in a direction away from the contact 118. This, in part, reduces and/or eliminates a parasitic capacitance between the top conductive body 108$a$ and the contact 118. This reduction and/or elimination of the parasitic capacitance increases a gain conversion of the digital readout of the pixel sensor 100 and/or decreases a noise in the digital readout of the pixel sensor 100, thereby reducing FPN in images produced from the pixel sensor 100.

In some embodiments, if the first distance $d_1$ is, for example, approximately 40 nanometers or greater, then the parasitic capacitance between the top conductive body 108$a$ and the contact 118 may be reduced while reducing a resistance between the floating diffusion node 110 and the contact 118. Further, by reducing the resistance, incorrect pixel resets during collection and/or transfer of charge in/from the photodetector 104 may be mitigated. In further embodiments, if the first distance $d_2$ is, for example, approximately 200 nanometers or less, then the parasitic capacitance between the top conductive body 108$a$ and the contact 118 is further reduced while maintaining a low gate resistance. In some embodiments, the first distance $d_1$ is larger than the second distance $d_2$ by a range of approximately 20 to 100 nanometers. In further embodiments, as shown in FIG. 1B, the first distance $d_1$ is defined from the sidewall 108s1 to a substantially straight line 120, and the second distance $d_2$ is defined from the sidewall 108s2 to the substantially straight line 120. In yet further embodiments, the substantially straight line 120 is tangent to a surface of the contact 118.

As shown in the top view of the pixel sensor 100 in FIG. 1B, the top conductive body 108a has a first shape and the bottom conductive body 108b has a second shape different than the first shape. For example, the first shape may be a pentagon and the second shape may be a rectangle. In some embodiments, a portion of the transfer gate dielectric 106 below the top surface of the substrate 102 may have a same shape as the bottom conductive body 108b (e.g., the second shape). At least a portion of the top conductive body 108a overhangs the bottom conductive body 108b. A first top perimeter segment 108a1 of a perimeter of the top conductive body 108a is defined between a first point $p_1$ and a second point $p_2$ with a first length $L_1$. In some embodiments, the first point $p_1$ is defined at a corner of the top conductive body 108a directly overlying the floating diffusion node 110, and the second point $p_2$ is defined at a location where an edge of the top conductive body 108a directly overlies the bottom conductive body 108b. A second top perimeter segment 108a2 of the perimeter of the top conductive body 108a is defined between a third point $p_3$ and a fourth point $p_4$ with a second length $L_2$. In some embodiments, the third point $p_3$ is defined at another location where the edge of the top conductive body 108a directly overlies the bottom conductive body 108b, and the fourth point $p_4$ is defined at another corner of the top conductive body 108a directly overlying the floating diffusion node 110. In some embodiments, the first length $L_1$ and/or the second length $L_2$ are respectively within a range of approximately 5 to 245 nanometers. In further embodiments, the first and second lengths $L_1$, $L_2$ are approximately the same. In yet further embodiments, the first perimeter segment 108a1 and the second top perimeter segment 108a2 may, for example, be the only top perimeter segments of the perimeter of the top conductive body 108a in contact with and/or overlying the floating diffusion node 110.

A first bottom perimeter segment 108b1 of a perimeter of the bottom conductive body 108b is defined between the second point $p_2$ and a fifth point $p_5$ with a third length $L_3$. In some embodiments, the fifth point $p_5$ is defined at a corner of the bottom conductive body 108b adjacent to the floating diffusion node 110. In some embodiments, the corner of the bottom conductive body 108b at the fifth point $p_5$ is separated from the floating diffusion node 110 by the transfer gate dielectric 106 only. A second bottom perimeter segment 108b2 of the perimeter of the bottom conductive body 108b is defined between the third point $p_3$ and the fifth point $p_5$ with a fourth length $L_4$. In some embodiments, the third length $L_3$ and/or the fourth length $L_4$ are respectively within a range of approximately 10 to 250 nanometers. In further embodiments, the first bottom perimeter segment 108b1 and the second bottom perimeter segment 108b2 may be the only segments of the perimeter of the bottom conductive body 108b in contact with and/or directly adjacent to the floating diffusion node 110. In some embodiments, a sum of the first and second lengths $L_1$, $L_2$ is smaller than a sum of the third and fourth lengths $L_3$, $L_4$. For example, the sum of the first and second lengths $L_1$, $L_2$ is smaller than the sum of the third and fourth lengths $L_3$, $L_4$ by at least 10 nanometers. Therefore, a length of the perimeter of the bottom conductive body 108b directly adjacent to the floating diffusion node 110 is greater than a length of the perimeter of the top conductive body 108a directly adjacent to and/or overhanging the floating diffusion node 110. This, in part, mitigates an accumulation of an electric field along the perimeter of the top conductive body 108a, thereby reducing and/or eliminating a "leakage" (i.e., a flow of current) between the top conductive body 108a and the floating diffusion node 110.

As shown in the cross-sectional view of the pixel sensor 100 in FIG. 1C, the corner of the top conductive body 108a at the fourth point $p_4$ directly overlies the floating diffusion node 110.

Figure 2A:
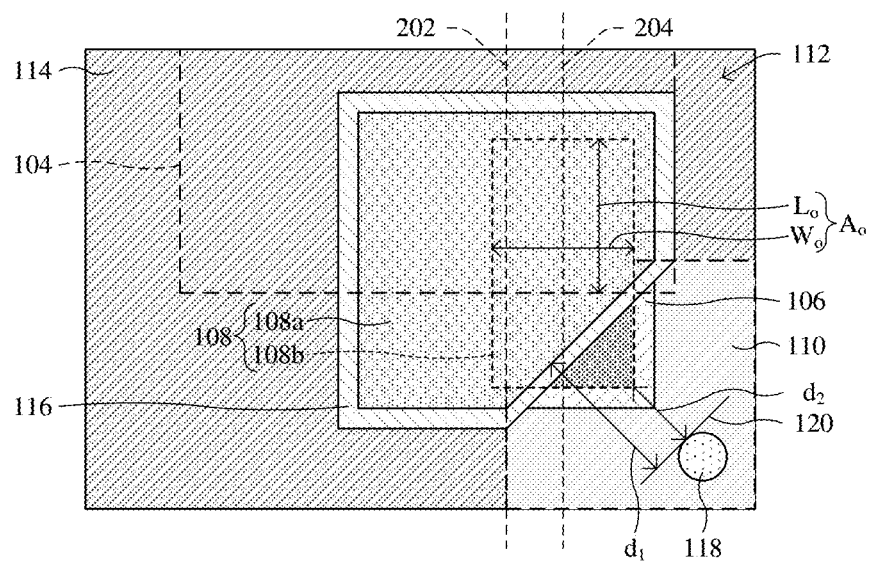
FIGS. 2A-2H illustrate various top views of alternative embodiments of the pixel sensor of FIGS. 1A-1C.

With reference to FIG. 2A, a top view of a pixel sensor 200a in accordance with some alternative embodiments of the top view of the pixel sensor 100 of FIG. 1B is provided. A first substantially straight line 202 is disposed at a center of the top conductive body 108a, and a second substantially straight line 204 is disposed at a center of the bottom conductive body 108b. The first substantially straight line 202 is laterally offset the second substantially straight line 204 by a non-zero distance. In some embodiments, the first substantially straight line 202 is substantially aligned with a sidewall of the float diffusion node 110.

Also as illustrated in FIG. 2A, an area $A_o$ of the bottom conductive body 108b overlaps the photodetector 104. The area $A_o$ has a length $L_o$ and a width $W_o$, such that the area $A_o$ is equal to the product of the length $L_o$ and width $W_o$. In some embodiments, the area $A_o$ is about 2,000 nanometers squared ($nm^2$) or greater. If, for example, the area $A_o$ is less than about 2,000 $nm^2$, then an incomplete transfer of accumulated charge from the photodetector 104 to the floating diffusion node 110 may occur. This, in part, may increase FPN in images produced from the pixel sensor 200a and/or decreases a reliability/sensitivity of the pixel sensor 200a.

Figure 2B:
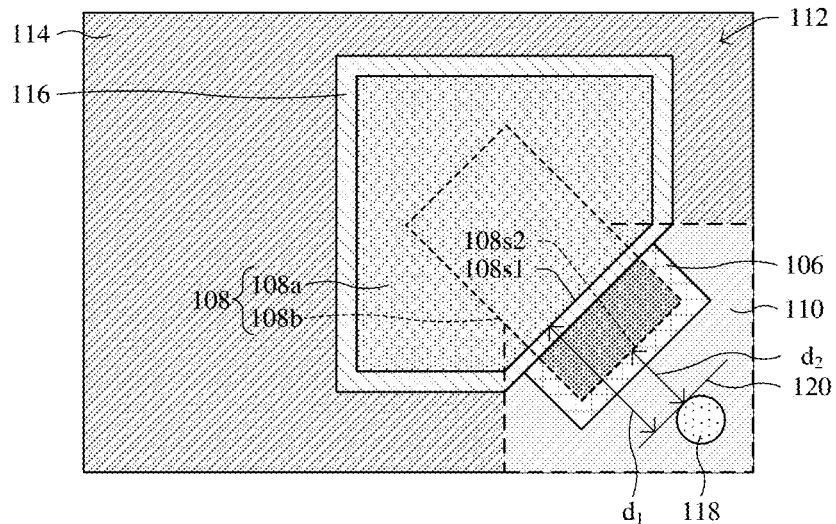

With reference to FIG. 2B, a top view of a pixel sensor 200b in accordance with some alternative embodiments of the top view of the pixel sensor 100 of FIG. 1B is provided. The sidewall 108s1 of the top conductive body 108a is parallel with the sidewall 108s2 of the bottom conductive body 108b.

Figure 2C:
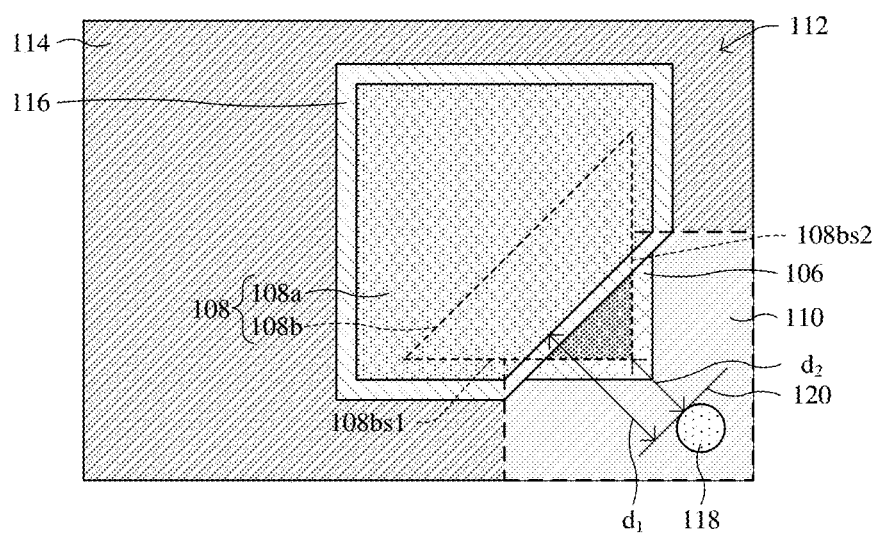

With reference to FIG. 2C, a top view of a pixel sensor 200c in accordance with some alternative embodiments of the top view of the pixel sensor 100 of FIG. 1B is provided. The top conductive body 108a has a first shape and the bottom conductive body 108b has a second shape different than the first shape. In some embodiments, as shown in FIG. 2C, the first shape is a pentagon and the second shape is a triangle. In further embodiments, the triangle is an isosceles triangle. For example, a length of a first sidewall 108bs1 of the bottom conductive body 108b is substantially equal to a length of a second sidewall 108bs2 of the bottom conductive body 108b.

Figure 2D:
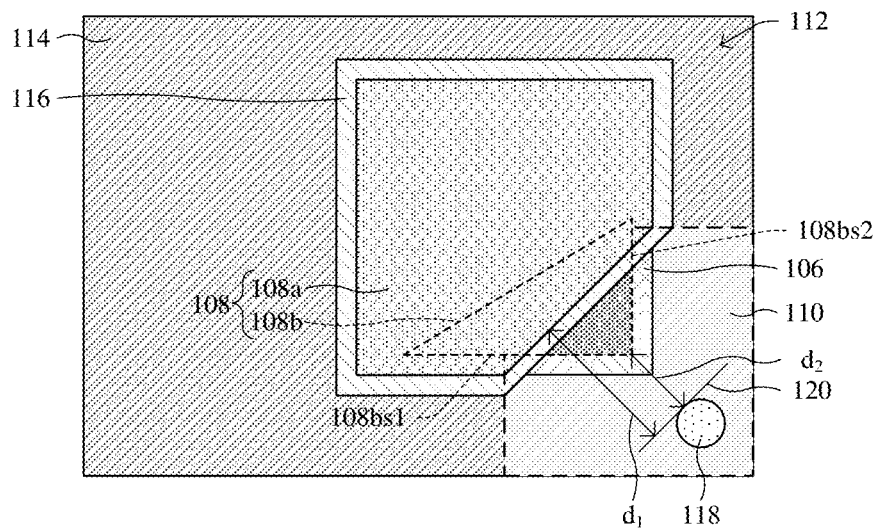

With reference to FIG. 2D, a top view of a pixel sensor 200d in accordance with some alternative embodiments of the top view of the pixel sensor 100 of FIG. 1B is provided. The length of the second sidewall 108bs2 of the bottom conductive body 108b is less than the length of the first sidewall 108bs1 of the bottom conductive body 108b. In some embodiments, embodiments, the length of the first sidewall 108bs1 is at least two times greater than the length of the second sidewall 108bs2.

Figure 2E:
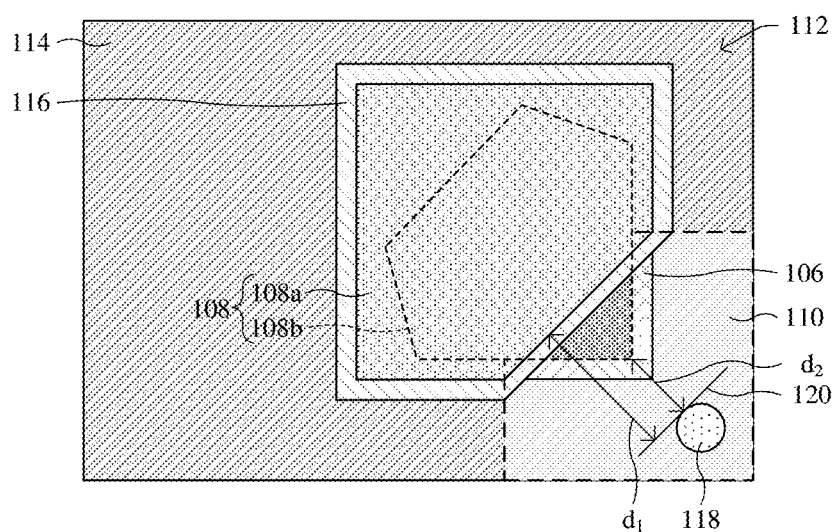

With reference to FIG. 2E, a top view of a pixel sensor 200e in accordance with some alternative embodiments of the top view of the pixel sensor 100 of FIG. 1B is provided. The top conductive body 108a has a first shape and the bottom conductive body 108b has a second shape different than the first shape. In some embodiments, as shown in FIG. 2E, the first shape is a pentagon and the second shape is a pentagon with a different layout than the first shape. In further embodiments, the pentagon of the first shape has sidewall lengths and/or angles different than sidewall lengths and/or angles of the pentagon of the second shape.

Figure 2F:
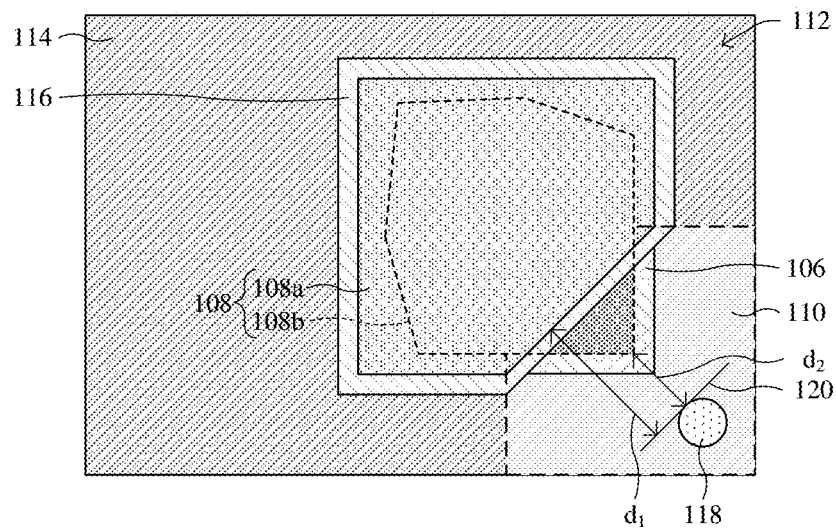

With reference to FIG. 2F, a top view of a pixel sensor 200f in accordance with some alternative embodiments of the top view of the pixel sensor 100 of FIG. 1B is provided. The top conductive body 108a has a first shape and the bottom conductive body 108b has a second shape different than the first shape. For example, the first shape is a pentagon and the second shape is a hexagon.

Figure 2G:
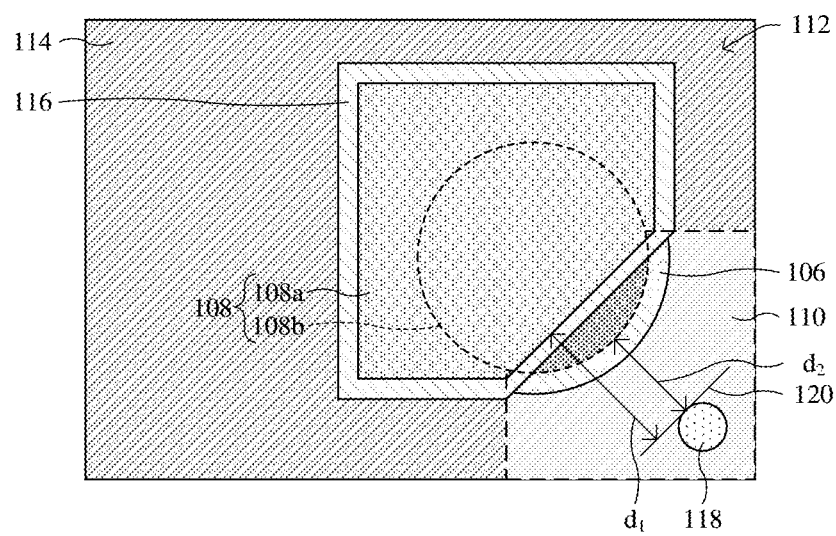

With reference to FIG. 2G, a top view of a pixel sensor 200g in accordance with some alternative embodiments of the top view of the pixel sensor 100 of FIG. 1B is provided. The top conductive body 108a has a first shape and the bottom conductive body 108b has a second shape different than the first shape. For example, the first shape is a pentagon and the second shape is a circle. A center of the bottom conductive body 108b is laterally offset a center of the top conductive body 108a (by a non-zero distance) in a direction towards the contact 118. In some embodiments, the center of the bottom conductive body 108b is disposed along a substantially straight diagonal line that intersects the center of the top conductive body 108a and a center of the contact 118.

Figure 2H:
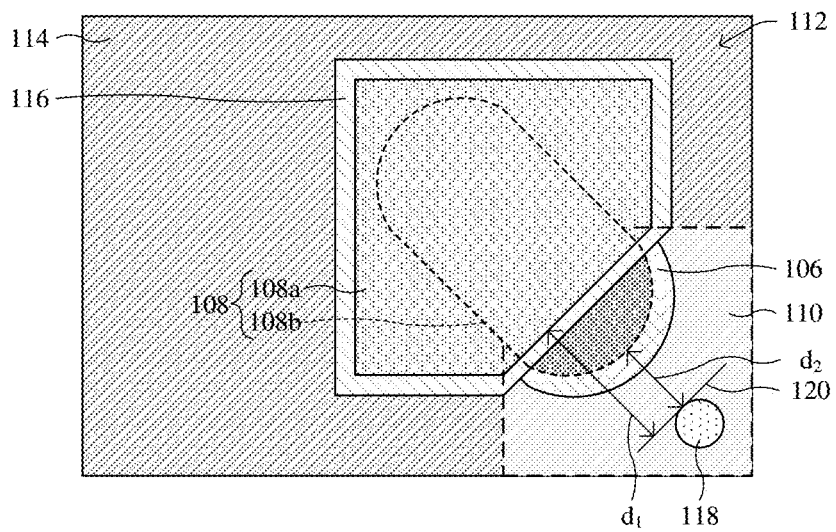

With reference to FIG. 2H, a top view of a pixel sensor 200h in accordance with some alternative embodiments of the top view of the pixel sensor 100 of FIG. 1B is provided. The top conductive body 108a has a first shape and the bottom conductive body 108b has a second shape different than the first shape. For example the first shape is a pentagon and the second shape is a stadium. A rounded surface of the second shape faces the contact 118.

Although not illustrated in the top views of FIGS. 1B and 2B-2H, an area $A_o$ of the bottom conductive body 108b overlaps the photodetector 104, as illustrated and described in FIG. 2A. The area $A_o$ is, for example, about 2,000 nm$^2$ or greater, thereby decreasing FPN in images produced from the pixel sensors of FIGS. 1B and 2B-2H and/or increasing a stability/sensitivity of the pixel sensors of FIGS. 1B and 2B-2H.

Figure 3A:
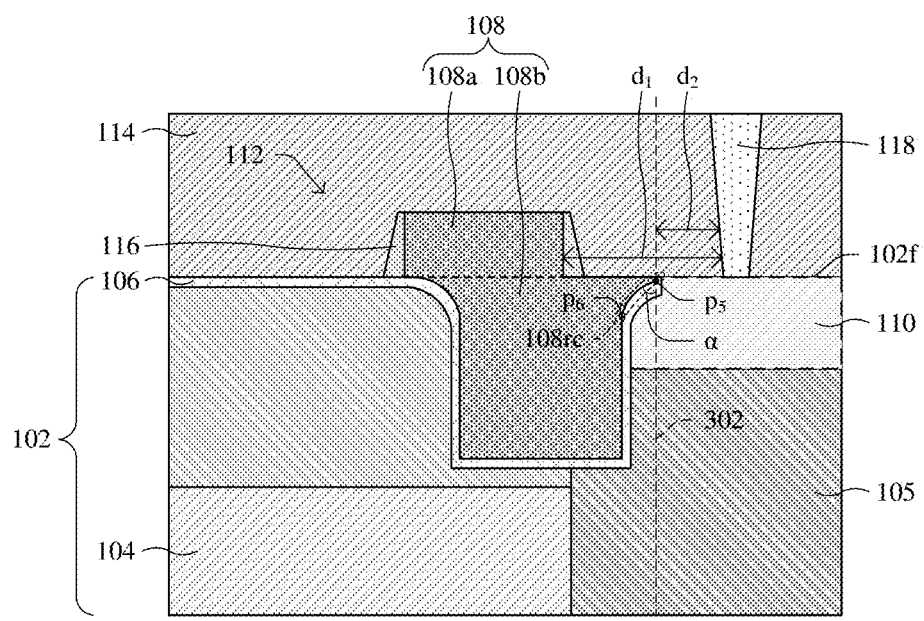
FIGS. 3A-3C illustrate various cross-sectional views of alternative embodiments of the pixel sensor of FIGS. 1A-1C.

With reference to FIG. 3A, a cross-sectional view of a pixel sensor 300a in accordance with some alternative embodiments of the cross-sectional view of the pixel sensor 100 of FIG. 1A is provided.

The transfer gate electrode 108 comprises the top conductive body 108a overlying the bottom conductive body 108b. The bottom conductive body 108b has rounded corners. In some embodiments, a rounded corner 108rc of the bottom conductive body 108b is directly adjacent to the floating diffusion node 110. In some embodiments, the rounded corner 108rc is defined from the fifth point $p_5$ and a sixth point $p_6$. The sixth point $p_6$ is defined at a location below a top surface of the bottom conductive body 108b and above a center of the floating diffusion node 110. In further embodiments, a slope of a curved surface of the rounded corner 108rc of the bottom conductive body 108b continuously decreases while moving along the curved surface from the fifth point $p_5$ to the sixth point $p_6$. An angle $\alpha$ defined between the rounded corner 108rc and a substantially straight line 302 may be within a range of approximately 30 to 90 degrees. In some embodiments, the substantially straight line 302 is perpendicular with the front side surface 102f of the substrate 102. By virtue of the rounded corner 108rc, accumulation of an electric field at the rounded corner 108rc is mitigated. Thus, the rounded corner 108rc of the bottom conductive body 108b may mitigate and/or eliminate a "leakage" (i.e., flow of current) between the bottom conductive body 108b and the floating diffusion node 110, thereby further decreasing FPN in images produced from the pixel sensor 300a.

Figure 3B:
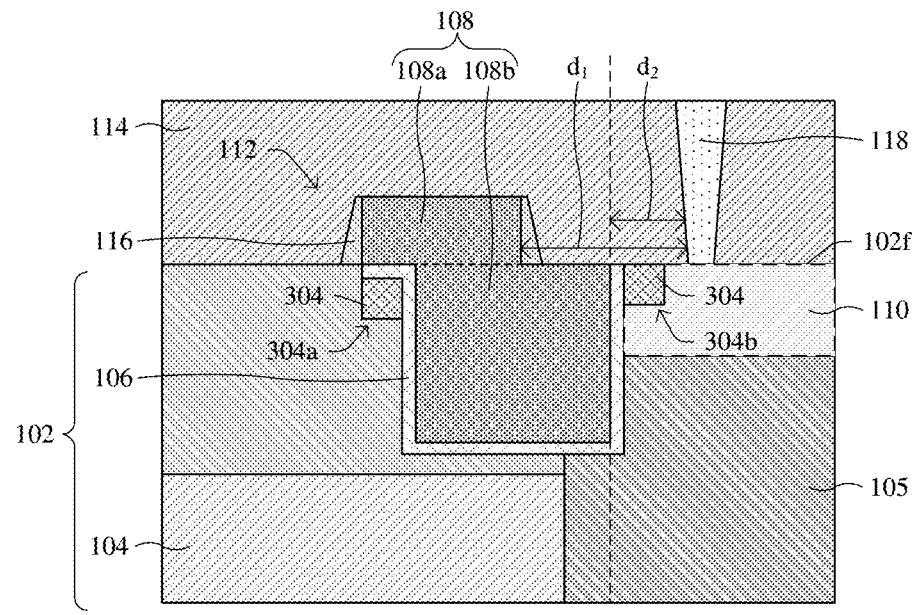

With reference to FIG. 3B, a cross-sectional view of a pixel sensor 300b in accordance with some alternative embodiments of the cross-sectional view of the pixel sensor 100 of FIG. 1A is provided.

An isolation structure 304 is disposed around the transfer gate dielectric 106. The isolation structure 304 is configured to increase electrical isolation between the floating diffusion node 110 and the transfer gate electrode 108. In some embodiments, the isolation structure 304 is a doped region of the substrate 102 having a first doping type (e.g., p-type) and the floating diffusion node 110 has a second doping type (e.g., n-type) opposite the first doping type. Because the isolation structure 304 and the floating diffusion node 110 have opposite doping types, depletions region forms at outer regions of the isolation structure 304. The depletion regions may, for example, form due to p-n junctions between the isolation structure 304 and the floating diffusion node 110. The formation of depletion regions at outer regions of the isolation structure facilitates electrical isolation between the transfer gate electrode 108 and the floating diffusion node 110. This, in part, decreases "leakage" (i.e., a flow of current) between the transfer gate electrode 108 and the floating diffusion node 110, thereby decreasing FPN in images produced from the pixel sensor 300b, while enhancing stability and reliability of the pixel sensor 300b. In some embodiments, the isolation structure 304 may comprise dielectric materials and/or be configured as a shallow trench isolation (STI) structure. In yet further embodiments, a portion of the isolation structure 304 in contact with the floating diffusion node 110 may comprise the second doping type (e.g., n-type) with a lower doping concentration than the floating diffusion node 110. By virtue of the lower doping concentration, the "leakage" between the floating diffusion node 110 and the transfer gate electrode 108 will be reduced and/or eliminated.

In further embodiments, a first segment 304a of the isolation structure 304 comprises the first doping type (e.g., p-type) with a higher doping concentration (e.g., p+) than the sensor well region 105 and a second segment 304b of the isolation structure 304 comprises the second doping type (e.g., n-type) with a lower doping concentration (e.g., n−) than the floating diffusion node 110. In some embodiments, the first segment 304a of the isolation structure 304 is laterally offset from the floating diffusion node 110 and the second segment 304b of the isolation structure 304 is in contact with the floating diffusion node 110. By virtue of the second segment 304b of the isolation structure 304 comprising a same doping type (e.g., n-type) as the floating diffusion node 110 with a lower doping concentration than the floating diffusion node 110, the "leakage" between the floating diffusion node 110 and the transfer gate electrode 108 will be reduced and/or eliminated.

Figure 3C:
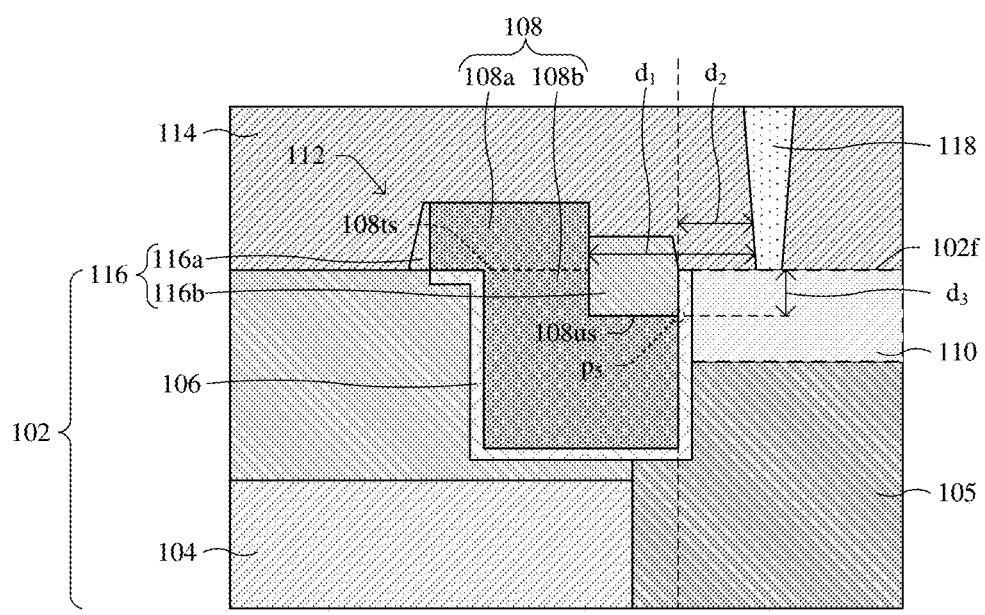

With reference to FIG. 3C, a cross-sectional view of a pixel sensor 300c in accordance with some alternative embodiments of the cross-sectional view of the pixel sensor 100 of FIG. 1A is provided.

The sidewall spacer 116 comprises a first sidewall spacer segment 116a and a second sidewall spacer segment 116b. In some embodiments, the sidewall spacer 116 is a continuous dielectric material (when viewed top down) extending continuously along sidewalls of the transfer gate electrode 108. A bottom surface of the first sidewall spacer segment 116a is substantially aligned with the front side surface 102f of the substrate 102. A bottom surface of the second sidewall spacer segment 116b is disposed below the front side surface 102f. An upper surface 108us of the bottom conductive body 108b is disposed below a top surface 108ts of the bottom conductive body 108b by a third distance $d_3$. The second sidewall spacer segment 116b is configured to enhance electrical isolation between a corner of the bottom conductive body 108b located at the point $p_5$ and the floating diffusion node 110. This, in part, decreases "leakage" (i.e., a flow of current) between the transfer gate electrode 108 and the floating diffusion node 110, thereby further decreasing FPN in images produced from the pixel sensor 300c, while enhancing stability and reliability of the pixel sensor 300c.

Figure 4A:
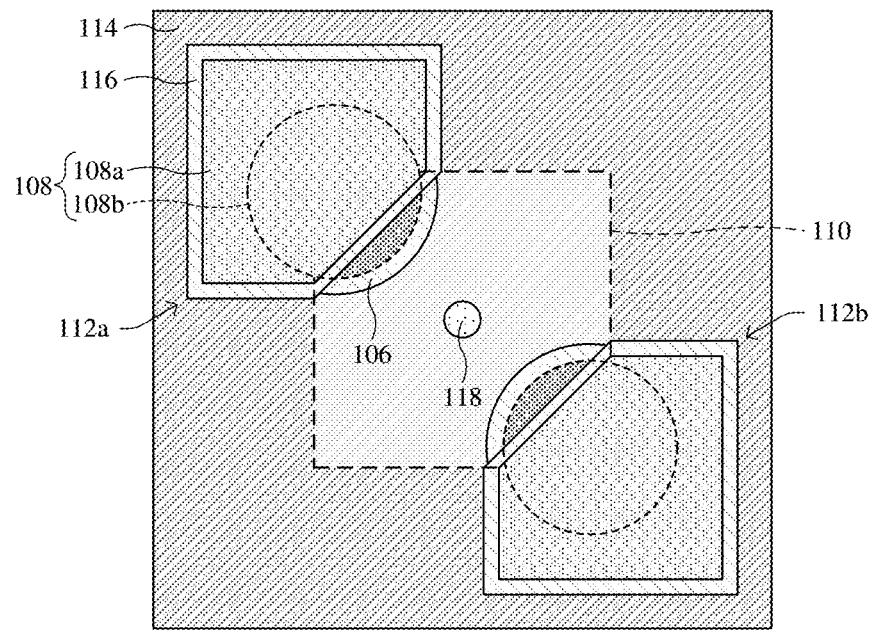
FIGS. 4A-4D illustrate various top views of alternative embodiments of the pixel sensor of FIGS. 1A-1C in which two or more vertical transfer transistors with low noise are disposed about a center contact.

With reference to FIG. 4A, some embodiments of a top view of a pixel sensor 400a comprising vertical transfer transistors 112a-b is provided.

In some embodiments, the vertical transfer transistors 112a-b are respectively configured as the vertical transfer transistor 112 of FIG. 2G, in which a photodetector is disposed below each vertical transfer transistor 112a-b. The vertical transfer transistors 112a-b are adjacent to the floating diffusion node 110. In some embodiments, centers of the vertical transfer transistors 112a-b are equidistant from a center of the contact 118.

Figure 4B:
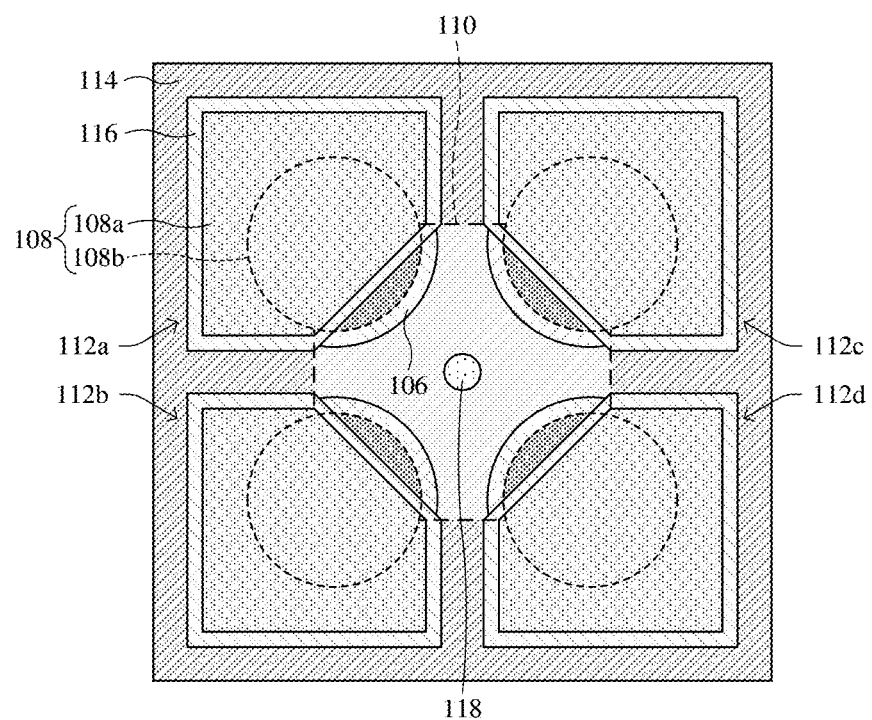

With reference to FIG. 4B, some embodiments of a top view of a pixel sensor 400b comprising vertical transfer transistors 112a-d is provided.

In some embodiments, the vertical transfer transistors 112a-d are respectively configured as the vertical transfer transistor 112 of FIG. 2G, in which a photodetector is disposed below each vertical transfer transistor 112a-d. The vertical transfer transistors 112a-d are adjacent to the floating diffusion node 110. In some embodiments, centers of the vertical transfer transistors 112a-d are equidistant from a center of the contact 118.

Figure 4C:
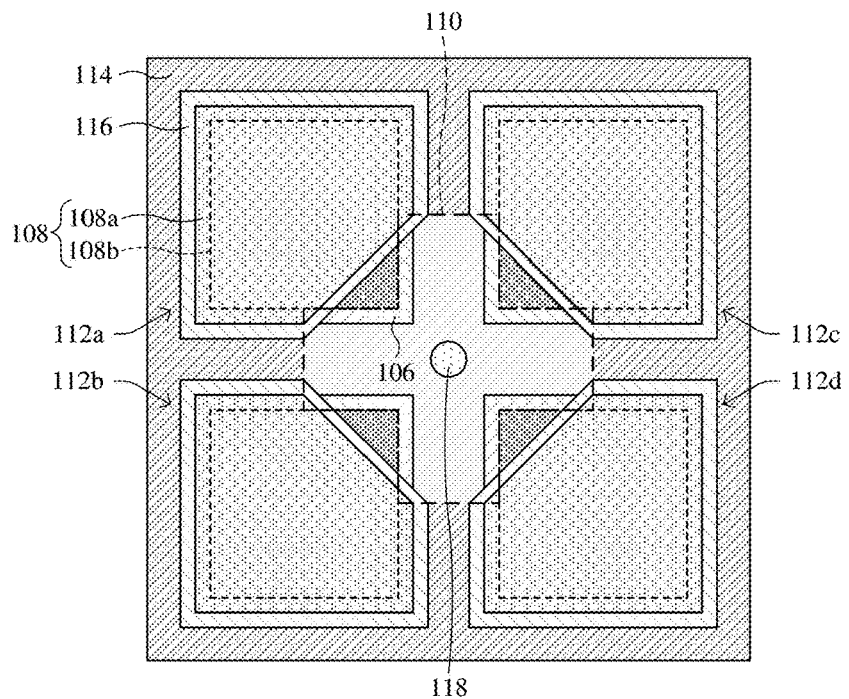

With reference to FIG. 4C, some embodiments of a top view of a pixel sensor 400c comprising vertical transfer transistors 112a-d is provided.

In some embodiments, the vertical transfer transistors 112a-d are respectively configured as the vertical transfer transistor 112 of FIG. 1B, in which a photodetector is disposed below each vertical transfer transistor 112a-d. The vertical transfer transistors 112a-d are adjacent to the floating diffusion node 110, such that the floating diffusion node 110 is plus shaped. In some embodiments, centers of the vertical transfer transistors 112a-d are equidistant from a center of the contact 118.

Figure 4D:
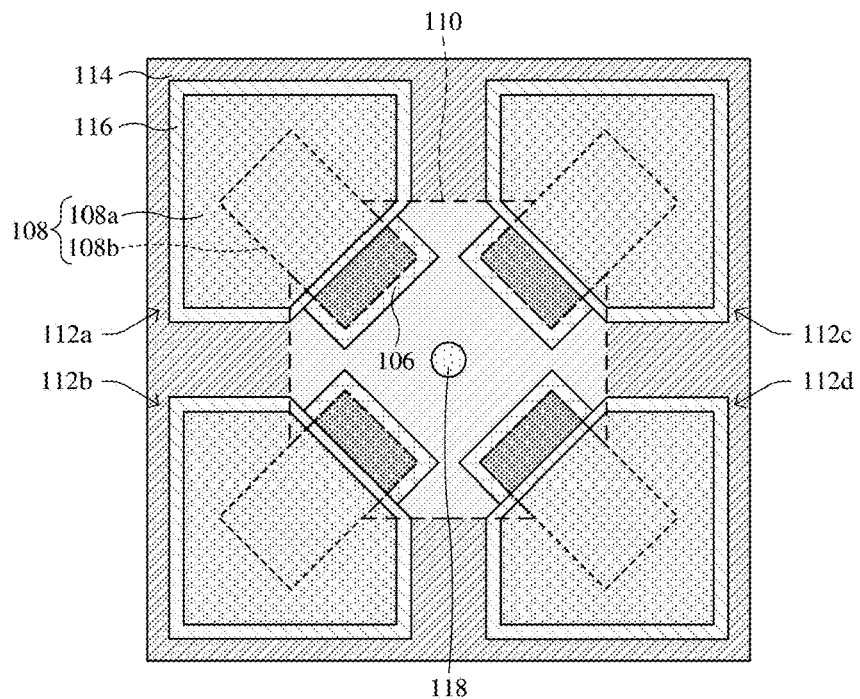

With reference to FIG. 4D, some embodiments of a top view of a pixel sensor 400d comprising vertical transfer transistors 112a-d is provided.

In some embodiments, the vertical transfer transistors 112a-d are respectively configured as the vertical transfer transistors 112 of FIG. 2B, in which a photodetector is disposed below each vertical transfer transistor 112a-d. The vertical transfer transistors 112a-d are adjacent to the floating diffusion node 110. In some embodiments, centers of the vertical transfer transistors 112a-d are equidistant from a center of the contact 118.

Figure 5A:
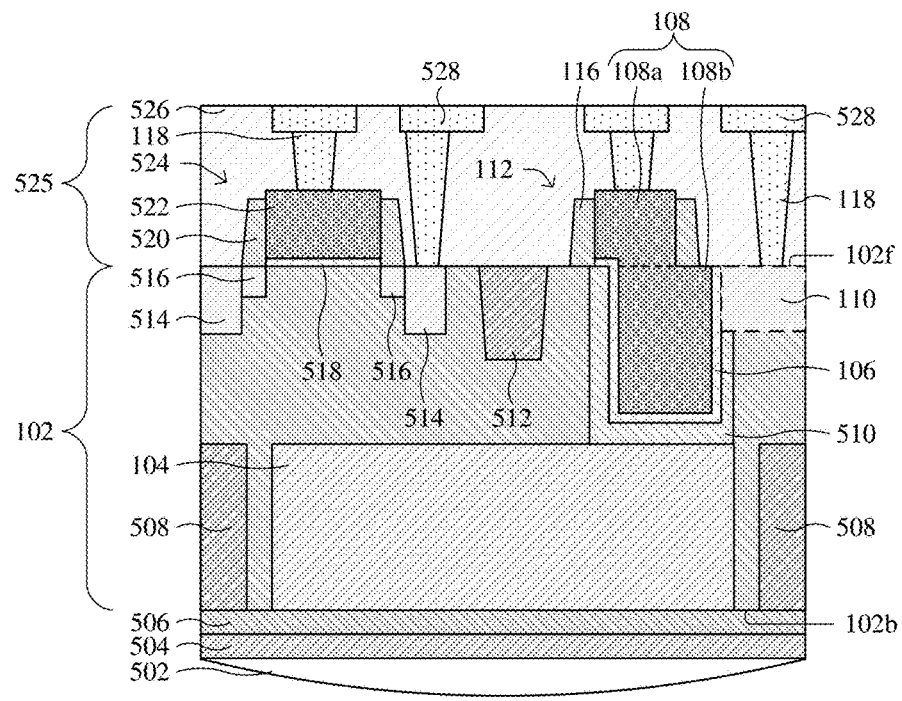
FIGS. 5A-5K illustrate various cross-sectional views of a pixel sensor having a vertical transfer transistor that has low noise and is laterally offset from another pixel device.

With reference to FIG. 5A, some embodiments of a pixel sensor 500a comprising a vertical transfer transistor 112 and a readout transistor 524 is provided.

An interconnect structure 525 overlies a front side surface 102f of the substrate 102. The substrate 102 has a first doping type (e.g., p-type). The interconnect structure 525 comprises an interconnect dielectric structure 526, contacts 118, and wires 528. The interconnect structure 525 is configured to electrically couple the vertical transfer transistor 112 and the readout transistor 524 to overlying conductive layers, adjacent semiconductor devices, and/or external semiconductor devices. The semiconductor devices may, for example, be varactor(s), resistor(s), capacitor(s), transistor(s), or the like. In some embodiments, the contacts 118 and/or the wires 528 may, for example, respectively be or comprise aluminum, tungsten, copper, or the like. The interconnect dielectric structure 526 may, for example, be one or more dielectric layers and/or one or more dielectric materials. The one or more dielectric materials may, for example, be or comprise an oxide, silicon oxide, a low-k dielectric, or the like.

The readout transistor 524 comprises a gate electrode 522, a gate dielectric 518, a sidewall spacer 520, lightly doped regions 516, and source/drain regions 514. In some embodiments, the readout transistor 524 may be configured as a source follower transistor, a reset transistor, or a row select transistor. The sidewall spacer 520 may, for example, be or comprise silicon nitride, silicon carbide, or the like. The gate dielectric 518 may, for example, be or comprise silicon oxide, a high-k dielectric, or the like. The gate electrode 522 may, for example, be or comprise aluminum, polysilicon, silicide, copper, titanium, tantalum, a combination of the aforementioned, or the like. The lightly doped regions 516 may be regions of the substrate 102 with a second doping type (e.g., n-type) opposite the first doping type. In some embodiments, the first doping type is p-type and the second doping type is n-type, or vice versa. The source/drain regions 514 may be regions of the substrate 102 with the second doping type, such that a doping concentration of the source/drain regions 514 are greater than a doping type of the lightly doped regions 516. A shallow trench isolation (STI) structure 512 is disposed in the substrate 102 laterally between the readout transistor 524 and the vertical transfer transistor 112. The STI structure 512 extends from the front side surface 102f of the substrate 102 to a point below the front side surface 102f.

In some embodiments, the vertical transfer transistor 112 is configured as the vertical transfer transistor 112 of FIG. 1A. The vertical transfer transistor 112 overlies the photodetector 104 and is configured to create a selectively conductive channel between the photodetector 104 and the floating diffusion node 110. In some embodiments, the floating diffusion node 110 has the second doping type (e.g., n-type) with a doping concentration approximately equal to or greater than the doping concentration of the source/drain regions 514. A lower gate implant region 510 surrounds the bottom conductive body 108b of the transfer gate electrode 108. The lower gate implant region 510 has the first doping type (e.g., p-type) with a higher doping concentration than the doping concentration of the lightly doped regions 516. The lower gate implant region 510 is configured to improve an interface between the transfer gate dielectric 106 and the substrate 102, thereby decreasing dark current in the vertical transfer transistor 112. This, in part, may decrease a noise in images produced by the pixel sensor 500a. Deep trench isolation (DTI) structures 508 extend from a back side surface 102b of the substrate 102 to a point above the back side surface 102b. The DTI structures 508 are configured to electrically isolate the photodetector 104 from other semiconductor devices on the substrate 102 and/or adjacent photodetectors.

An anti-reflection layer 506 is disposed on the back side surface 102b of the substrate 102. The anti-reflection layer 506 is configured to reduce the amount of incident radiation reflected by the substrate 102. In some embodiments, the anti-reflection layer 506 may, for example, be or comprise an oxide, a high-k dielectric, a nitride, or the like. In further embodiments, the anti-reflection layer 506 may comprise a first layer comprising an oxide stack on a second layer comprising a high-k dielectric, or vice versa. A color filter 504 directly contacts the anti-reflection layer 506. The color filter 504 is configured to transmit specific wavelengths of incident radiation. A lens 502 is disposed on the color filter 504. The lens 502 is configured to focus incident radiation (e.g., photons) towards the photodetector 104.

Figure 5B:
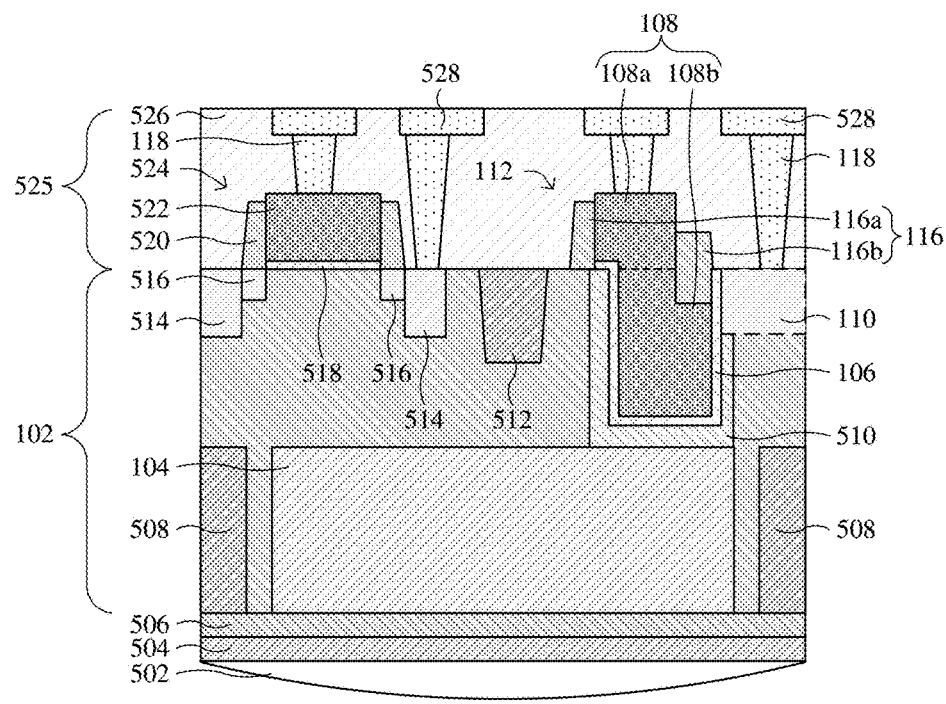

With reference to FIG. 5B, a cross-sectional view of a pixel sensor 500b in accordance with some alternative embodiments of the pixel sensor 500a of FIG. 5A is provided. The transfer gate electrode 108 is configured as the transfer gate electrode 108 of FIG. 3C, and the sidewall spacer 116 is configured as the sidewall spacer 116 of FIG. 3C.

Figure 5C:
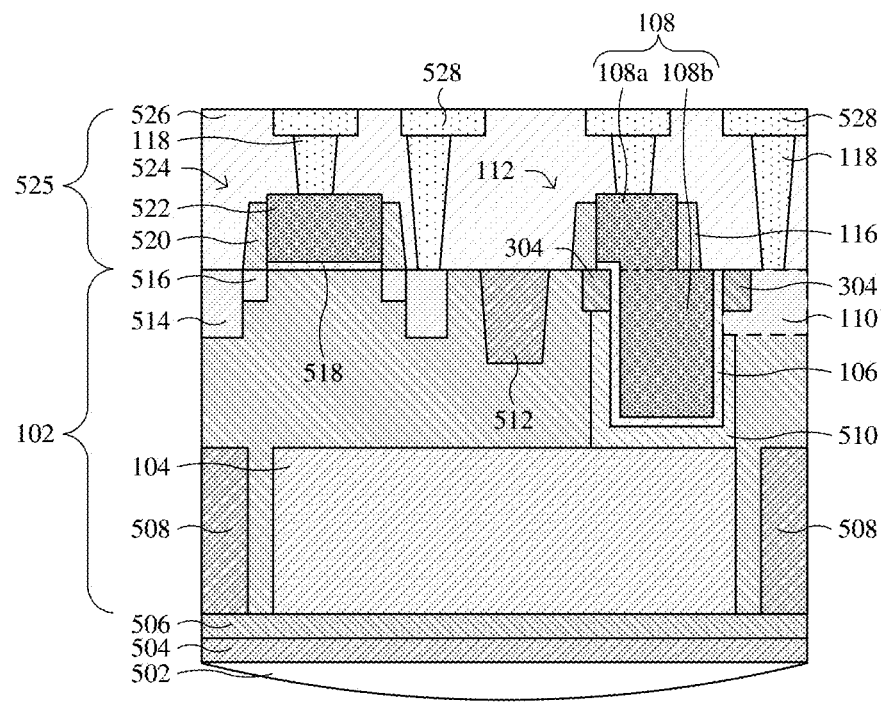

With reference to FIG. 5C, a cross-sectional view of a pixel sensor 500c in accordance with some alternative embodiments of the pixel sensor 500a of FIG. 5A is provided. The transfer gate electrode 108 is configured as the transfer gate electrode 108 of FIG. 3B, such that the isolation structure 304 wraps around sidewalls of the transfer gate dielectric 106.

Figure 5D:
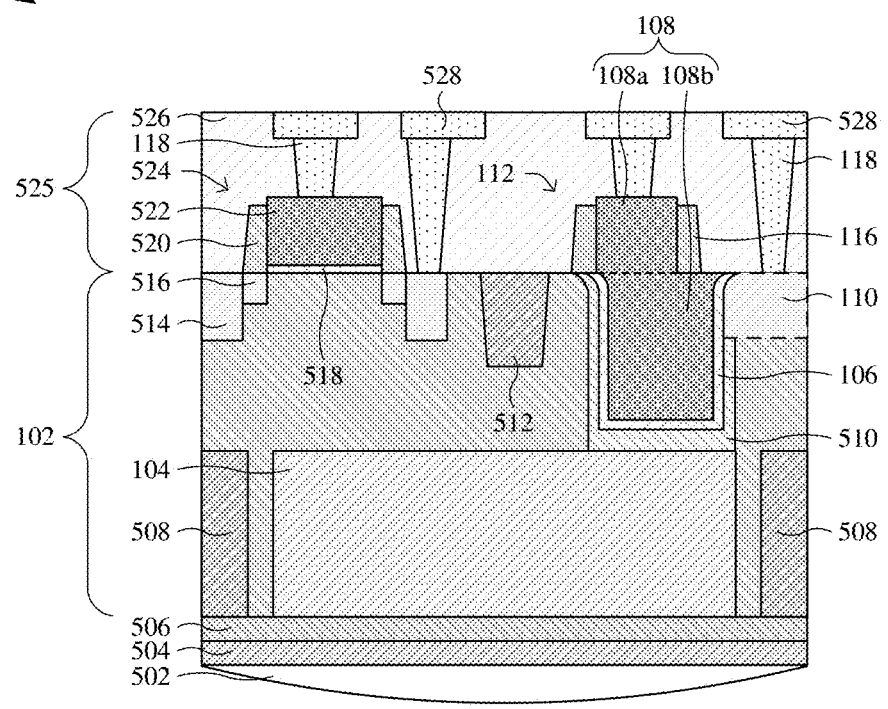

With reference to FIG. 5D, a cross-sectional view of a pixel sensor 500d in accordance with some alternative embodiments of the pixel sensor 500a of FIG. 5A is provided. The transfer gate electrode 108 is configured as the transfer gate electrode 108 of FIG. 3A, such that the bottom conductive body 108b and the transfer gate dielectric 106 respectively have rounded corners.

Figure 5E:
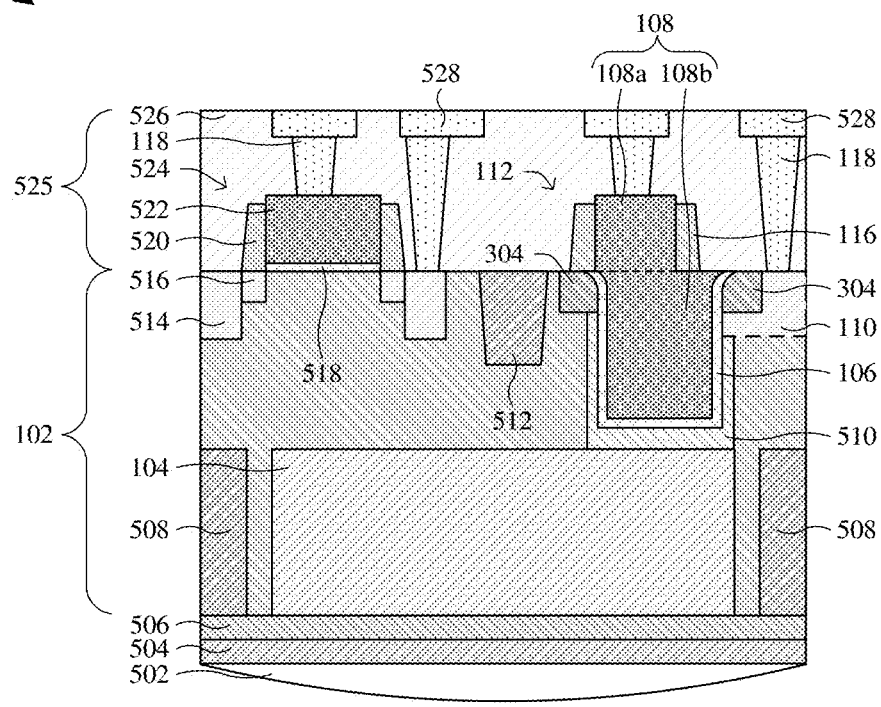

With reference to FIG. 5E, a cross-sectional view of a pixel sensor 500e in accordance with some alternative embodiments of the pixel sensor 500a of FIG. 5A is provided. The bottom conductive body 108b comprises rounded corners as described and illustrated in the pixel sensor 300a of FIG. 3A. This, in part, decreases "leakage" (i.e., a flow of current) between the transfer gate electrode 108 and the floating diffusion node 110, thereby decreasing FPN in images produced from the pixel sensor 500e, while enhancing stability and reliability of the pixel sensor 500e.

Further, an isolation structure 304 is disposed around the transfer gate dielectric 106 as illustrated and described in the pixel sensor 300b of FIG. 3B. The isolation structure 304 is configured to increase electrical isolation between the floating diffusion node 110 and the transfer gate electrode 108. In some embodiments, the isolation structure 304 is a doped region of the substrate 102 having a first doping type (e.g., p-type) and the floating diffusion node 110 has a second doping type (e.g., n-type) opposite the first doping type. Because the isolation structure 304 and the floating diffusion node 110 have opposite doping types, depletion regions form at outer regions of the isolation structure. The depletion regions may, for example, form due to p-n junctions between the isolation structure 304 and the floating diffusion node 110. The formation of depletion regions at outer regions of the isolation structure facilitates electrical isolation between the transfer gate electrode 108 and the floating diffusion node 110. This, in part, further decreases "leakage" (i.e., a flow of current) between the transfer gate electrode 108 and the floating diffusion node 110, thereby decreasing FPN in images produced from the pixel sensor 500e, while further enhancing stability and reliability of the pixel sensor 500e. In further embodiments, a portion of the isolation structure 304 in contact with the floating diffusion node 110 may comprise the second doping type (e.g., n-type) with a lower doping concentration than the floating diffusion node 110. By virtue of the lower doping concentration, the "leakage" between the floating diffusion node 110 and the transfer gate electrode 108 will be reduced and/or eliminated.

Figure 5F:
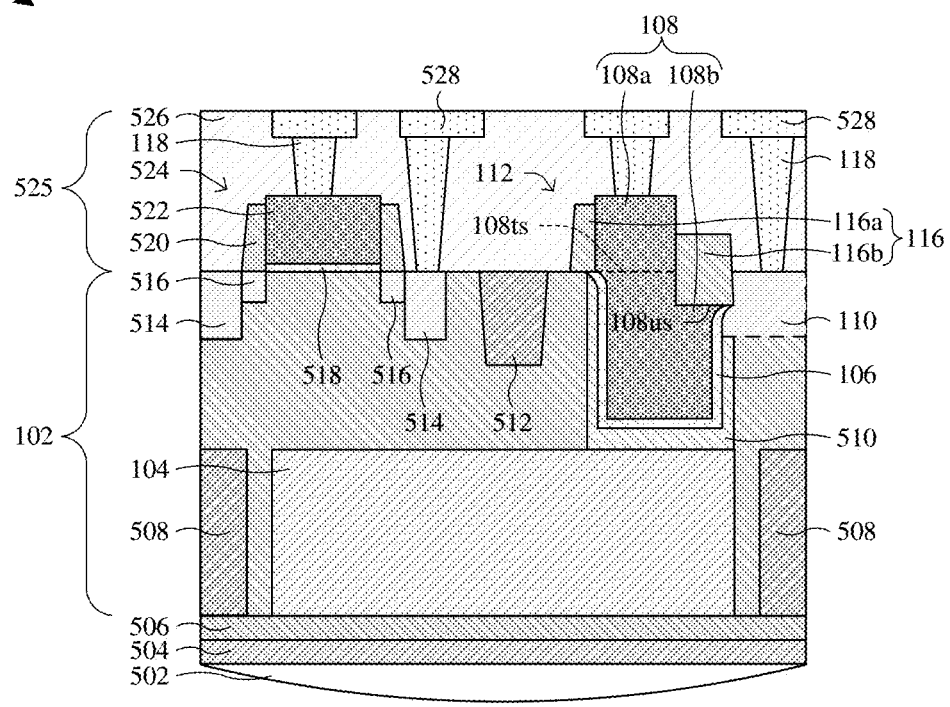

With reference to FIG. 5F, a cross-sectional view of a pixel sensor 500f in accordance with some alternative embodiments of the pixel sensor 500a of FIG. 5A is provided. The bottom conductive body 108b comprises rounded corners as described and illustrated in the pixel sensor 300a of FIG. 3A, such that a rounded corner of the bottom conductive body 108b is directly adjacent to the floating diffusion node 110. This, in part, decreases "leakage" (i.e., a flow of current) between the transfer gate electrode 108 and the floating diffusion node 110, thereby decreasing FPN in images produced from the pixel sensor 500f, while enhancing stability and reliability of the pixel sensor 500f.

Further, the sidewall spacer 116 is illustrated and described as in the pixel sensor 300c of FIG. 3C, in which the sidewall spacer 116 comprises a first sidewall spacer segment 116a and a second sidewalls spacer segment 116b. A bottom surface of the first sidewall spacer segment 116a is substantially aligned with a top surface of the floating diffusion node 110. A bottom surface of the second sidewall spacer segment 116b is disposed below the top surface of the floating diffusion node 110. An upper surface 108us of the bottom conductive body 108b is disposed below a top surface 108ts of the bottom conductive body 108b by a non-zero distance. The second sidewall spacer segment 116b is configured to enhance electrical isolation between the rounded corner of the bottom conductive body 108b and the floating diffusion node 110. This, in part, further decreases "leakage" (i.e., a flow of current) between the transfer gate electrode 108 and the floating diffusion node 110, thereby further decreasing FPN in images produced from the pixel sensor 500f, while further enhancing stability and reliability of the pixel sensor 500f.

Figure 5G:
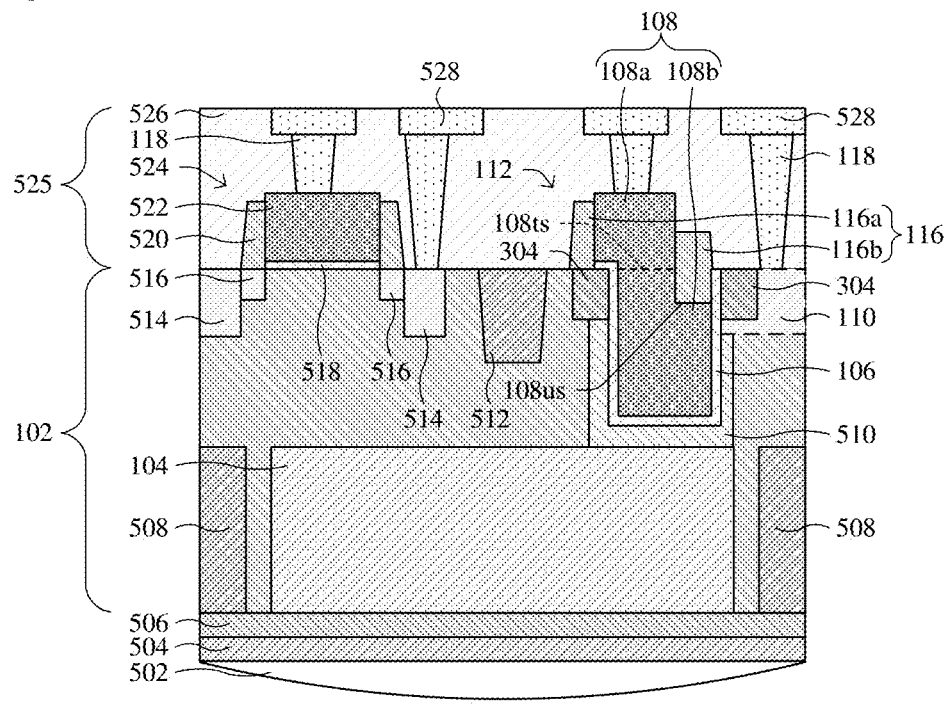

With reference to FIG. 5G, a cross-sectional view of a pixel sensor 500g in accordance with some variations of the pixel sensor 500f of FIG. 5F without rounded corners is provided. Further, the pixel sensor 500g includes the isolation structure 304 as configured and described in FIG. 3B.

Figure 5H:
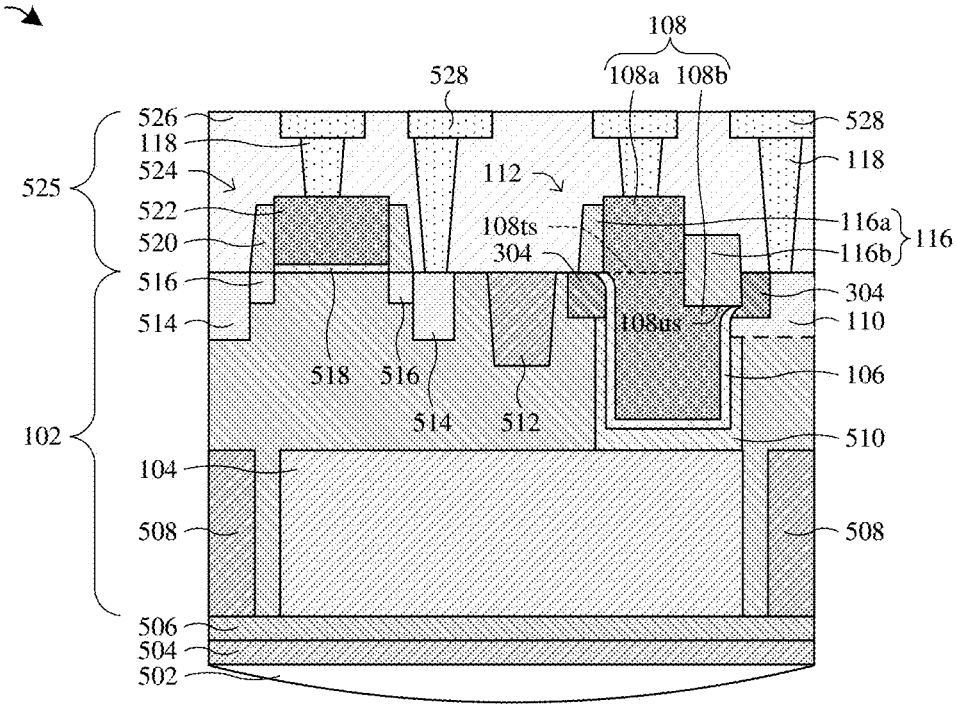

With reference to FIG. 5H, a cross-sectional view of a pixel sensor 500h in accordance with some variations of the pixel sensor 500f of FIG. 5F is provided. The pixel sensor 500h includes some embodiments of the isolation structure 304 as configured and described in FIG. 3B.

Figure 5I:
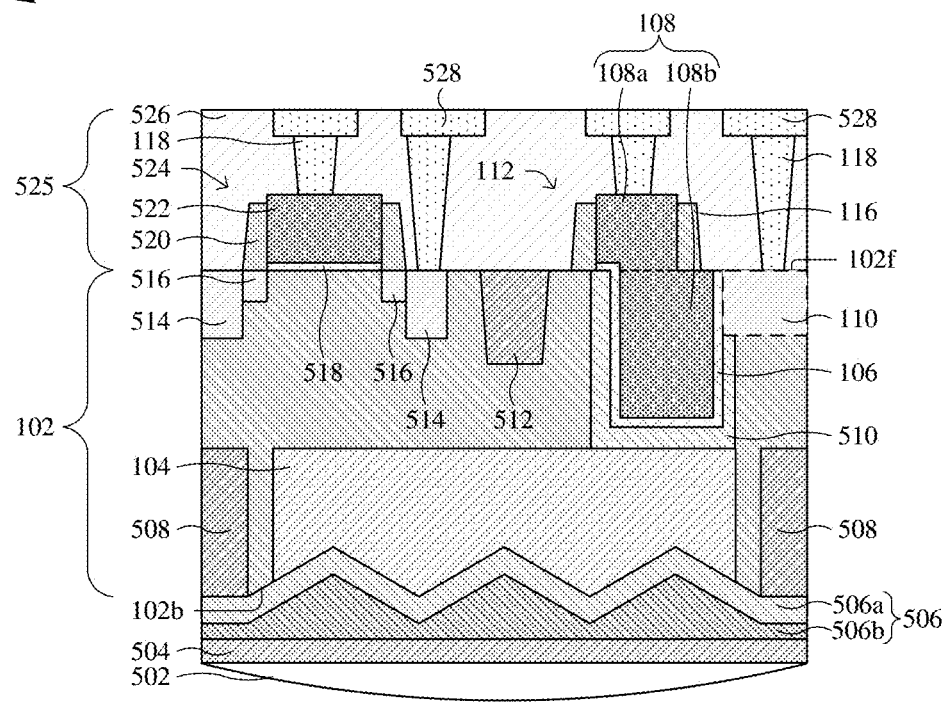

With reference to FIG. 5I, a cross-sectional view of a pixel sensor 500i in accordance with some alternative embodiments of the pixel sensor 500a of FIG. 5A is provided. The anti-reflection layer 506 comprises a first anti-reflection layer 506a and a second anti-reflection layer 506b. In some embodiments, the first anti-reflection layer 506a may, for example, be or comprise a high-k dielectric, a nitride, or the like In some embodiments, the second anti-reflection layer 506b may, for example, be or comprise an oxide, such as silicon oxide, or the like. The first anti-reflection layer 506a may, for example, have a non-flat pattern (e.g., a jig-saw pattern) configured to increase a light receiving surface area for incident radiation disposed upon the photodetector 104. This, in part, increases a sensitivity and/or quantum efficiency (QE) of the pixel sensor 500i.

Figure 5J:
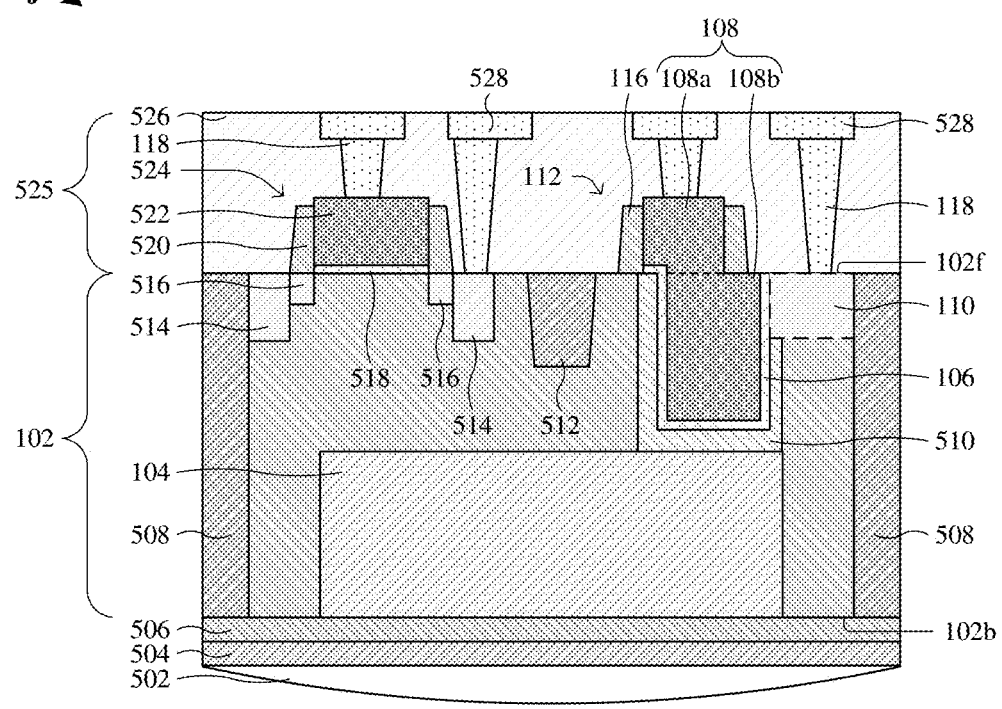

With reference to FIG. 5J, a cross-sectional view of a pixel sensor 500j in accordance with some alternative embodiments of the pixel sensor 500a of FIG. 5A is provided. The deep trench isolation (DTI) structure 508 extends from the front side surface 102f of the substrate 102 to the back side surface 102b of the substrate 102. This configuration of the DTI structure 508 further increases electrical isolation between the photodetector 104 and other semiconductor devices (e.g., adjacent pixel devices) disposed on the substrate 102 and/or adjacent photodetectors. This, in part, decreases cross-talk between the photodetector 104 and adjacent photodetectors and/or decreases noise in images produced from the pixel sensor 500j, while enhancing stability and reliability of the pixel sensor 500j.

Figure 5K:
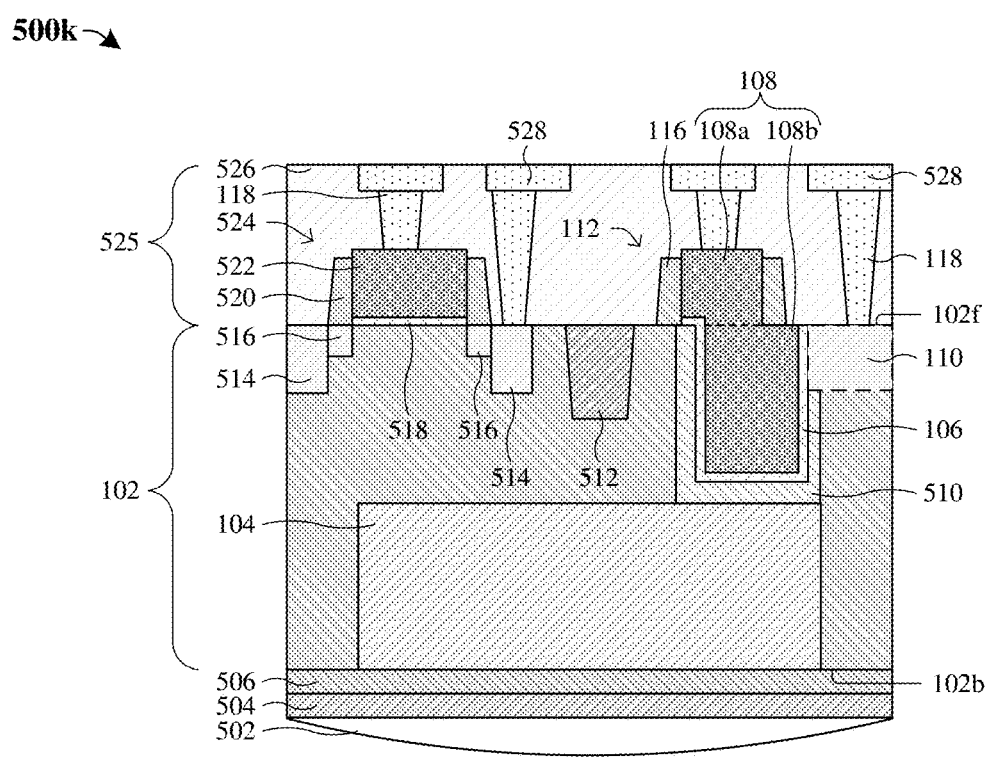

With reference to FIG. 5K, a cross-sectional view of a pixel sensor 500k in accordance with some alternative embodiments of the pixel sensor 500a of FIG. 5A is provided. The DTI structure (508 of FIG. 5A) is omitted, thereby decreasing costs and time associated with forming the pixel sensor 500a.

FIGS. 6-14 illustrate cross-sectional views 600-1400 of some embodiments of a method of forming a pixel sensor according to aspects of the present disclosure. Although the cross-sectional views 600-1400 shown in FIGS. 6-14 are described with reference to a method, it will be appreciated that the structures shown in FIGS. 6-14 are not limited to the method but rather may stand alone separate of the method. Although FIGS. 6-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 6-14 may, for example, be employed to form the pixel sensor 500a of FIG. 5A.

Figure 6:
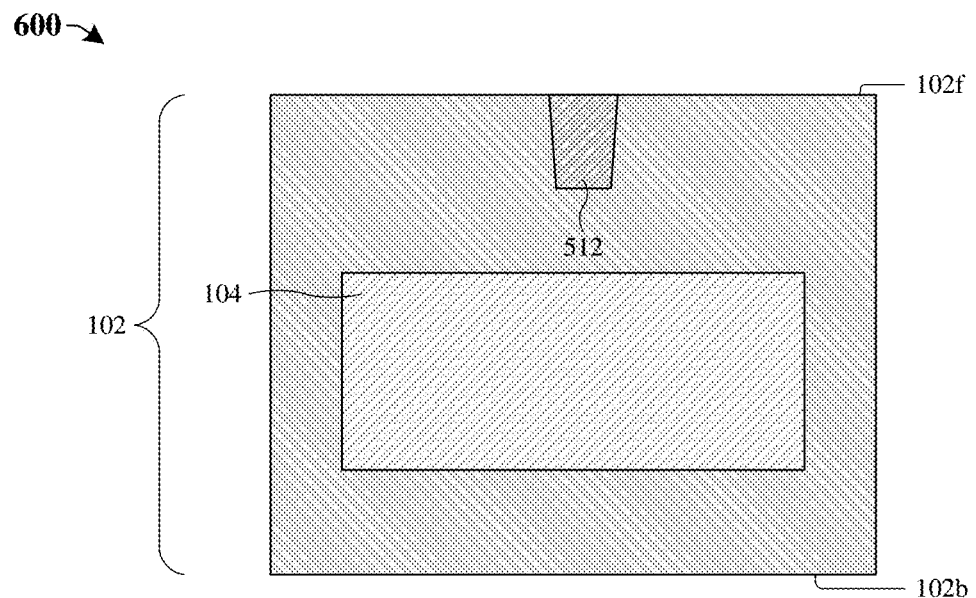
FIGS. 6-14 illustrate a series of cross-sectional views of some embodiments of a method for forming a pixel sensor having a vertical transfer transistor that has low noise and is laterally offset from another pixel device.

As shown in cross-sectional view 600 of FIG. 6, a substrate 102 is provided and a shallow trench isolation (STI) structure 512 is formed on a front side surface 102f of the substrate 102. In some embodiments, the substrate 102 may, for example, be a bulk substrate (e.g., a bulk silicon substrate), a silicon-on-insulator (SOI) substrate, or some other suitable substrate. In some embodiments, before forming the STI structure 512, a first implant process is performed to dope the substrate 102 with a first doping type (e.g., p-type). In some embodiments, a process for forming the STI structure 512 may comprise: 1) selectively etching the substrate 102 to form a trench in the substrate 102 that extends into the substrate 102 from the front side surface 102f of the substrate 102; and 2) filling (e.g., by chemical vapor deposition (CVD), physical vapor deposition (PVD), atomic layer deposition (ALD), thermal oxidation, sputtering, etc.) the trench with a dielectric material. In further embodiments, the substrate is selectively etched by forming a masking layer (not shown) on the front side surface 102f of the substrate 102, and subsequently exposing the substrate 102 to one or more etchants configured to selectively remove unmasked portions of the substrate 102. In yet further embodiments, the dielectric material may comprise an oxide (e.g., silicon oxide), a nitride, or the like.

Also shown in cross-sectional view 600 of FIG. 6, a photodetector 104 is formed in the substrate 102. The photodetector 104 is a region of the substrate comprising a second doping type (e.g., n-type) opposite the first doping type. In some embodiments, the photodetector 104 may be formed by a selective ion implantation process that utilizes a masking layer (not shown) on the front side surface 102f of the substrate 102 to selectively implant ions into the substrate 102.

Figure 7:
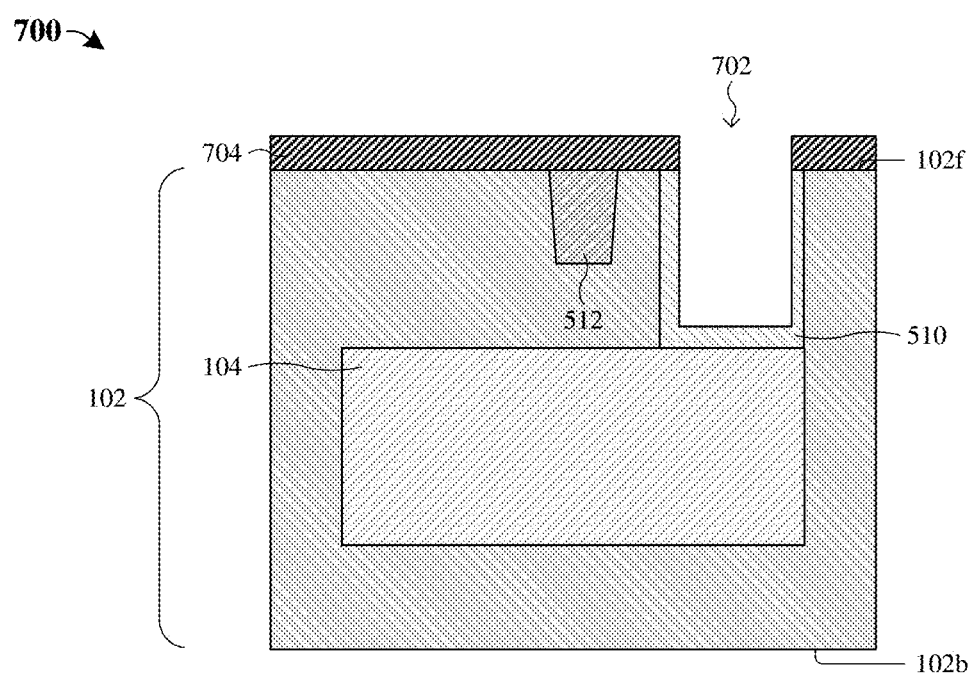

As shown in cross-sectional view 700 of FIG. 7, the substrate 102 is patterned according to the masking layer 704, thereby defining a vertical transistor opening 702. In some embodiments, the vertical transistor opening 702 may have a top layout similar to or the same as a top layout of the bottom conductive body 108b as illustrated in any one or a combination of FIGS. 1B and/or 2A-2H. After performing the patterning process a lower gate implant region 510 having the first doping type (e.g., p-type) is formed in the substrate 102. In some embodiments, the lower gate implant region 510 is formed by performing a selective implant process according to the masking layer 704 to selectively implant ions into the substrate 102. In further embodiments, after preforming the selective implant process a removal process (not shown) is performed to remove the masking layer 704.

In some embodiments, after forming the lower gate implant region 510 another selective implant process is performed according to the masking layer 704 to implant ions into the substrate 102. The other selective implant process is performed to form an isolation structure (e.g., 304 of FIG. 3B) such as illustrated and described in FIG. 3B. In further embodiments, the isolation structure (e.g., 304 of FIG. 3B) may comprise the first doping type (e.g., p-type) with a higher doping concentration than the lower gate implant region 510. In some embodiments, the another selective implant process may, for example, be performed by exposing the substrate 102 to one or more etchants at a non-zero angle relative to a straight line that is perpendicular to the front side surface 102f of the substrate 102. This, in part, confines the implant of the one or more etchants to an upper region of the substrate 102, such as illustrated by the isolation structure 304 of FIG. 3B. In some embodiments, the non-zero angle is within a range of approximately −30 to 30 degrees.

Figure 8:
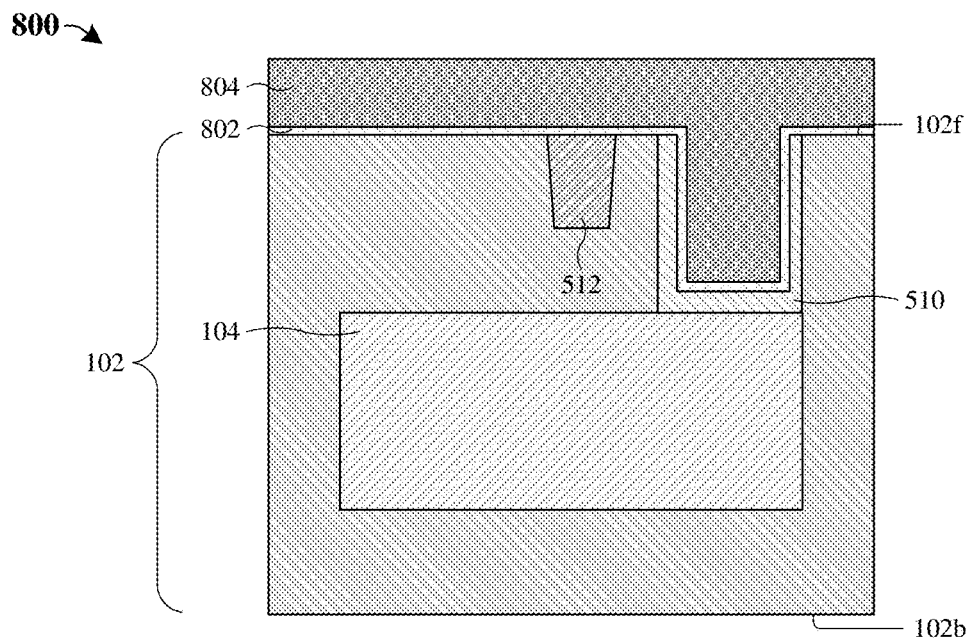

As shown in cross-sectional view 800 of FIG. 8, a gate dielectric layer 802 is formed over the substrate 102. The gate dielectric layer 802 overlies the front side surface 102f of the substrate 102 and lines the vertical transistor opening (702 of FIG. 7). In some embodiments, the gate dielectric layer 802 may, for example, be or comprise silicon oxide, a high-k dielectric material, or the like. The gate dielectric layer 802 may be deposited and/or grown by CVD, PVD, ALD, thermal oxidation, sputtering, or another suitable deposition process. A gate electrode layer 804 is formed over the gate dielectric layer 802, such that the gate electrode layer 804 fills a remaining portion of the vertical transistor opening (702 of FIG. 7). In some embodiments, the gate electrode layer 804 may, for example, be or comprise aluminum, copper, tungsten, titanium, tantalum, intrinsic polysilicon, doped polysilicon, silicide, or the like.

Figure 9:
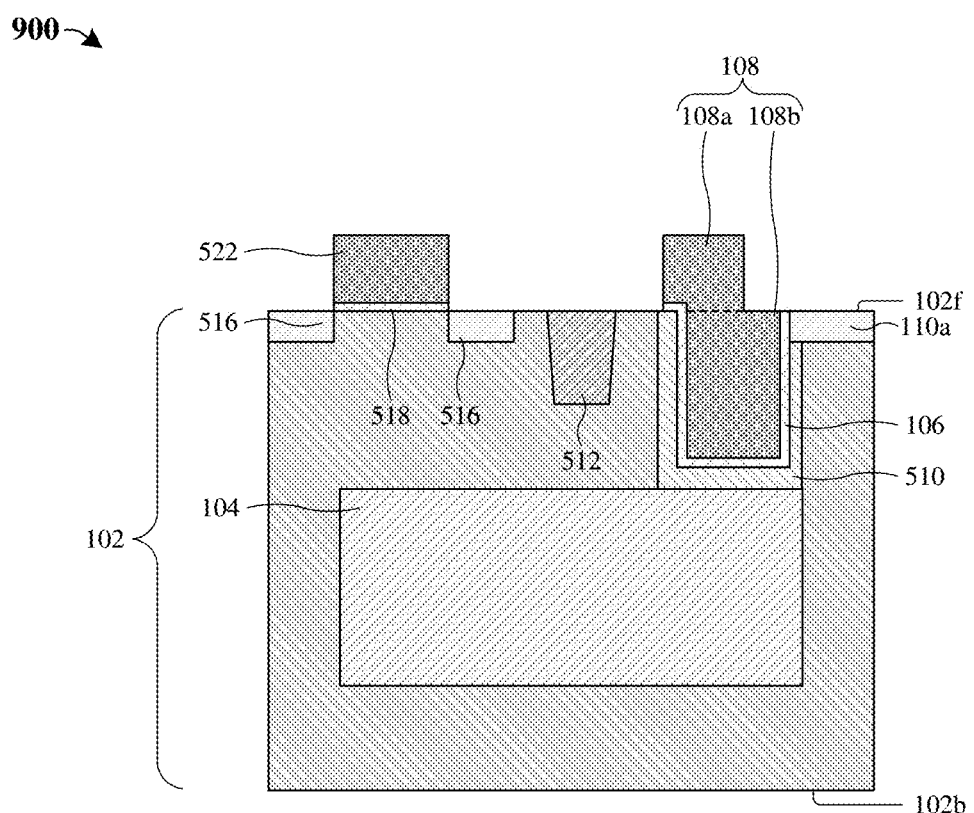

As shown in cross-sectional view 900 of FIG. 9, the gate dielectric layer (802 of FIG. 8) and the gate electrode layer (804 of FIG. 8) are patterned, thereby defining a transfer gate electrode 108, a gate electrode 522, a transfer gate dielectric 106, and a gate dielectric 518. In some embodiments, the patterning process is performed such that a top conductive body 108a and a bottom conductive body 108b of the transfer gate electrode 108 may respectively have a top layout similar to or the same as a top layout of the top and bottom conductive bodies 108a, 108b as illustrated and described in any one or a combination of FIGS. 1B and/or 2A-2H. In some embodiments, the patterning includes: 1) forming a masking layer (not shown) over the gate electrode layer (804 of FIG. 8); 2) exposing unmasked portions of the gate dielectric layer (802 of FIG. 8) and the gate electrode layer (804 of FIG. 8) to one or more etchants; and 3) removing the masking layer. After forming the transfer gate electrode 108 and the gate electrode 522, lightly doped regions 516 are formed on either side of the gate electrode 522 and a lightly doped region 110a is formed on one side of the transfer gate electrode 108. In some embodiments, the lightly doped regions 516, 110a respectively have the second doping type (e.g., n-type). In some embodiments, the lightly doped regions 516, 110a may be formed by a selective ion implantation process that utilizes a masking layer (not shown) on the front side surface 102f of the substrate 102 to selectively implant ions into the substrate 102.

Figure 10:
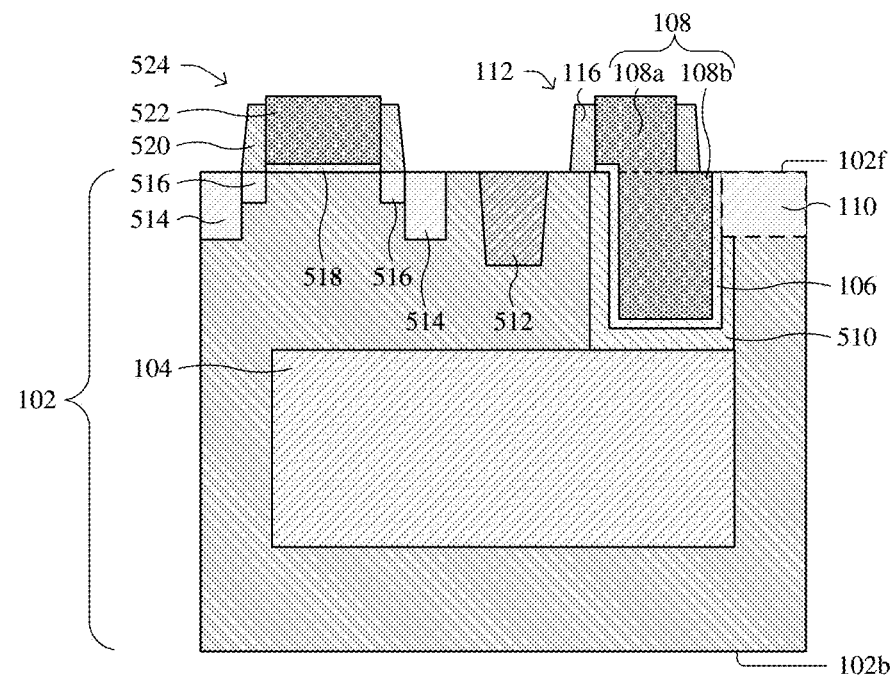

As shown in cross-sectional view 1000 of FIG. 10, sidewall spacers 116, 520 are formed on the front side surface 102f of the substrate and along sidewalls of the transfer gate electrode 108 and sidewalls of the gate electrode 522. Further, source/drain regions 514 and the floating diffusion node 110 are formed on the front side surface 102f of the substrate 102, thereby defining the readout transistor 524 and the vertical transfer transistor 112, respectively. The source/drain regions 514 and the floating diffusion node 110 respectively have the second doping type (e.g., n-type) with a higher doping concentration than the lightly doped regions 516.

In some embodiments, the sidewall spacers 116, 520 may be formed by depositing (e.g., by CVD, PVD, ALD, sputtering, etc.) a spacer layer over the front side surface 102f of the substrate 102. The spacer layer is subsequently etched to remove the spacer layer from horizontal surfaces, thereby forming the sidewall spacer 116 around sidewalls of the transfer gate electrode 108 and the sidewall spacer 520 around sidewalls of the gate electrode 522. In some embodiments, the spacer layer may, for example, be or comprise a nitride, an oxide, or some other dielectric material. In some embodiments, the source/drain regions 514 and the floating diffusion node 110 may be formed by a selective ion implantation process that utilizes a masking layer (not shown) on the front side surface 102f of the substrate 102 to selectively implant ions (e.g., n-type such as phosphorus) into the substrate 102. In further embodiments, an anneal process (e.g., laser anneal, rapid thermal anneal (RTA), etc.) is performed after the source/drain regions 514 and the floating diffusion node 110 are formed, to activate the selectively implanted dopants.

Figure 11:
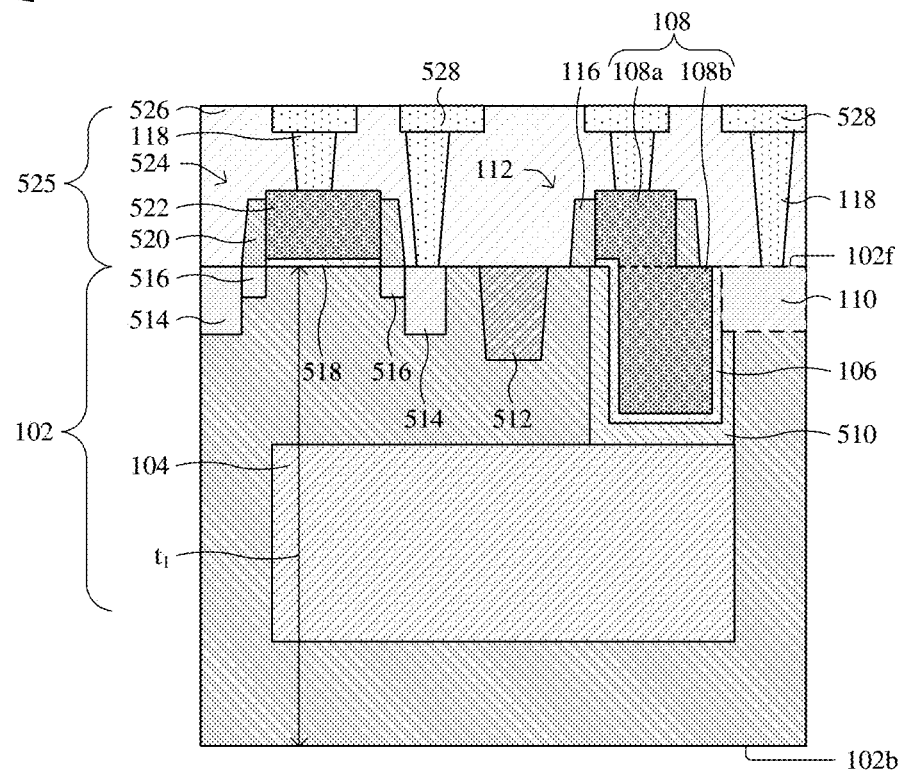

As shown in cross-sectional view 1100 of FIG. 11, an interconnect structure 525 is formed over the front side surface 102f of the substrate 102. The interconnect structure 525 comprises an interconnect dielectric structure 526, contacts 118, and wires 528. In some embodiments, the interconnect dielectric structure 526 may be formed with a substantially planar upper surface and may, for example, be or comprise an oxide, a nitride, a low-k dielectric, or the like. In some embodiments, the interconnect dielectric structure 526 may be formed by CVD, PVD, ALD, sputtering, or the like. In further embodiments, a planarization process (e.g., a chemical-mechanical planarization (CMP) process) may be performed on the interconnect dielectric structure 526 to form the substantially planar upper surface.

In some embodiments, the contacts 118 are formed in the interconnect dielectric structure 526. Further, the contacts 118 extend from the wires 528 to doped regions of the substrate 102 (e.g., source/drain regions 514 and/or the floating diffusion node 110) and transistor gate electrodes (e.g., gate electrode 522 and/or transfer gate electrode 108). In some embodiments, a process for forming the contacts 118 comprises depositing a lower portion of the interconnect dielectric structure 526, subsequently performing an etch into the lower portion to form contact openings that correspond to the contacts 118. In further embodiments, the contact openings may be filled by depositing or growing a conductive material (e.g., tungsten) covering the interconnect dielectric structure 526 that fills the contact openings, and subsequently performing a planarization process (e.g., CMP) on the contacts 118 and the interconnect dielectric structure 526.

Also as shown in FIG. 11, the wires 528 are formed in the interconnect dielectric structure 526 over each contact 118. In some embodiments, a process for forming the wires 528 comprises: 1) depositing an upper portion of the interconnect dielectric structure 526; 2) forming a masking layer (not shown) over the upper portion; 3) performing an etch process into the upper portion to form wire openings that correspond to the wires 528; 4) filling the openings with a conductive material (e.g., copper); and 5) subsequently performing a planarization process on the conductive material and the masking layer. Further, the substrate 102 has a thickness ti defined from the front side surface 102f of the substrate 102 to a back side surface 102b of the substrate 102.

Figure 12:
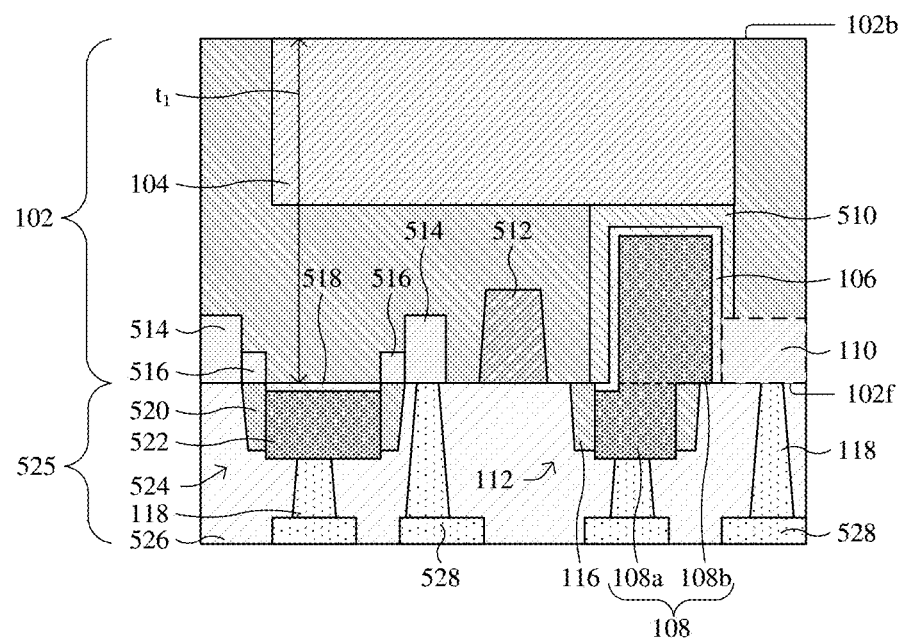

As shown in cross-sectional view 1200 of FIG. 12, the structure of FIG. 11 is rotated 180 degrees and the substrate 102 is thinned, such that the substrate 102 has a reduced thickness. For example, the thickness ti of the substrate 102 in FIG. 12 is less than the thickness ti of the substrate 102 in FIG. 11. In some embodiments, the thinning may expose the photodetector 104 on the back side surface 102b of the substrate 102. The thinning may, for example, be performed by a planarization process, an etch back process, a grinding process, a combination of the aforementioned, or the like. In further embodiments, the planarization process may be a CMP process. In some embodiments, before performing the thinning process on the structure of FIG. 11, the interconnect structure 525 is bonded to another semiconductor wafer (not shown). For example, the another semiconductor wafer may be or comprise an application-specific integrated circuit (ASIC) wafer having an ASIC interconnect structure (not shown) overlying an ASIC substrate (not shown), where the ASIC interconnect structure directly contacts the interconnect structure 525 after the bonding process. One or more semiconductor devices may be disposed within and/or on the ASIC substrate. In further embodiments, the bonding process may include, for example, a fusion bond, a hybrid bond, or another suitable bonding process.

Figure 13:
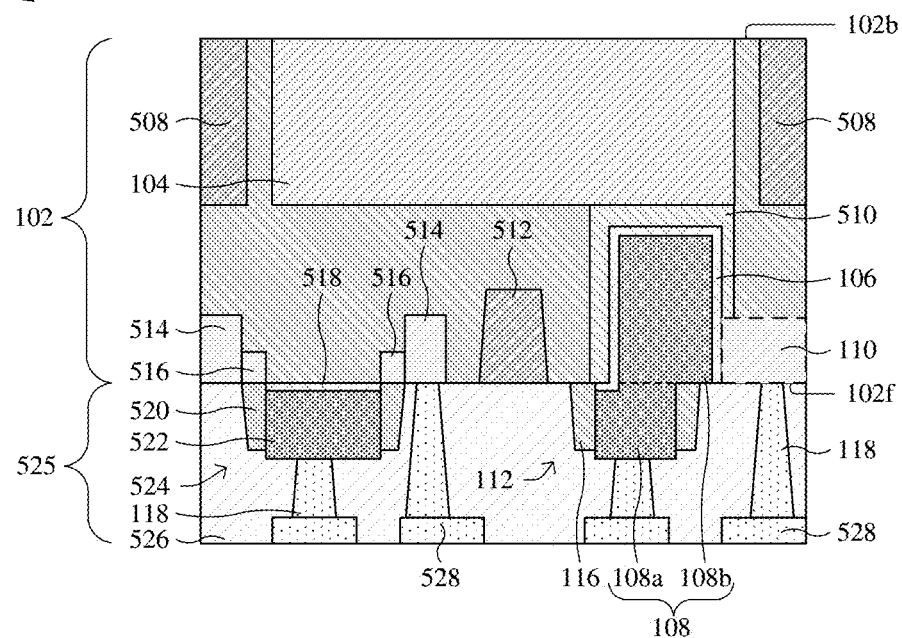

As shown in cross-sectional view 1300 of FIG. 13, a deep trench isolation (DTI) structure 508 is formed in the substrate 102. The DTI structure 508 extends into the substrate 102 from the back side surface 102b to a point below the back side surface 102b. In some embodiments, the DTI structure 508 extends from the back side surface 102b to the front side surface 102f of the substrate 102 (e.g., such as FIG. 5J). In some embodiments, a process for forming the DTI structure 508 comprises: 1) selectively etching the substrate 102 to from trenches in the substrate 102 that extend into the substrate 102 from the back side surface 102b; and 2) subsequently filling the trenches (e.g., by CVD, PVD, ALD, thermal oxidation, sputtering, etc.) with a dielectric material.

Figure 14:
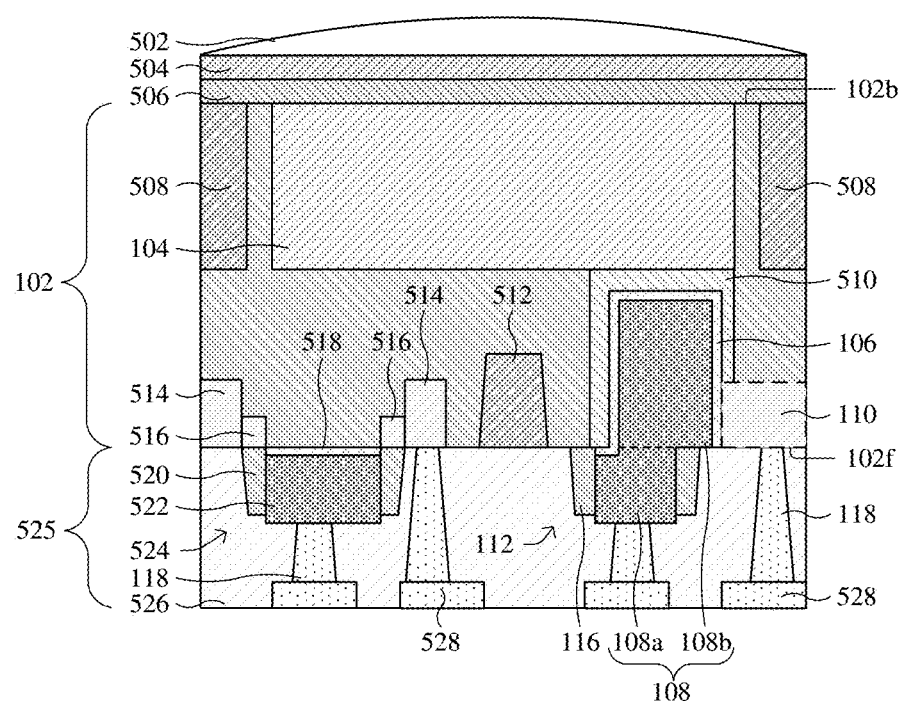

As shown in cross-sectional view 1400 of FIG. 14, an anti-reflection layer 506 is formed over the back side surface 102b of the substrate 102. In some embodiments, the anti-reflection layer 506 is formed on the photodetector 104 and the DTI structure 508. In some embodiments, the anti-reflection layer 506 may be formed by CVD, PVD, ALD, sputtering, or the like. In further embodiments, the anti-reflection layer 506 may be planarized (e.g., via a CMP) subsequent to formation. Further, a color filter 504 is formed on the anti-reflection layer 506. The color filter 504 is formed of material that allows for the transmission of incident radiation (e.g., light) having a specific wavelength range, while blocking incident wavelength with another wavelength outside of the specified range. In further embodiments, the color filter 504 may be formed by CVD, PVD, ALD, sputtering, or the like and/or may be planarizaed (e.g., via CMP) subsequent to formation.

Furthermore, as shown in FIG. 14, a lens 502 is formed over the color filter 504. The lens 502 may be formed by depositing a lens material on the color filter 504 (e.g., by a spin-on method or a deposition process). A lens template (not shown) having a curved upper surface is patterned above the lens material. The lens 502 is then formed by selectively etching the lens material according to the lens template.

Figure 15:
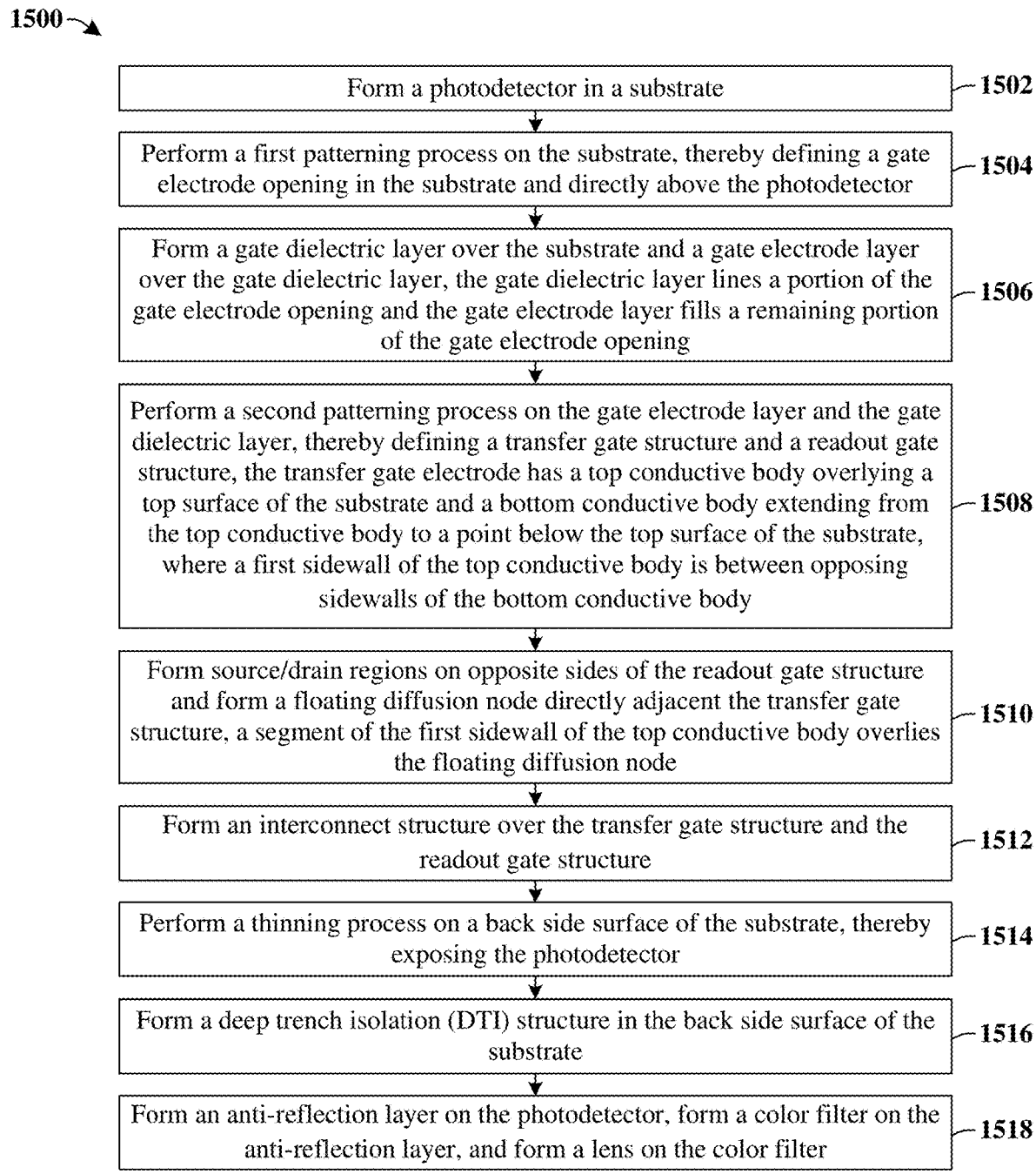
FIG. 15 illustrates a flowchart of some embodiments of a method for forming a pixel sensor having a vertical transfer transistor that has low noise and is laterally offset from another pixel device.

FIG. 15 illustrates a method 1500 of forming a pixel sensor according to the present disclosure. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1502, a photodetector is formed in a substrate. FIG. 6 illustrates a cross-sectional view 600 corresponding to some embodiments of act 1502.

At act 1504, a first patterning process is performed on the substrate, thereby defining a gate electrode opening in the substrate and directly above the photodetector. FIG. 7 illustrates a cross-sectional view 700 corresponding to some embodiments of act 1504.

At act 1506, a gate dielectric layer is formed over the substrate and a gate electrode layer is formed over the gate dielectric layer. The gate dielectric layer lines a portion of the gate electrode opening and the gate electrode layer fills a remaining portion of the gate electrode opening. FIG. 8 illustrates a cross-sectional view 800 corresponding to some embodiments of act 1506.

At act 1508, a second patterning process is performed on the gate electrode layer and the gate dielectric layer, thereby defining a transfer gate structure and a readout gate structure. The transfer gate electrode has a top conductive body overlying a top surface of the substrate and a bottom conductive body extending from the top conductive body to a point below the top surface of the substrate. A first sidewall of the top conductive body is between opposing sidewalls of the bottom conductive body. FIG. 9 illustrates a cross-sectional view 900 corresponding to some embodiments of act 1508.

At act 1510, source/drain regions are formed on opposite sides of the readout gate structure and a floating diffusion node is formed directly adjacent the transfer gate structure. The first sidewall of the top conductive body partially overlies the floating diffusion node. FIG. 10 illustrates a cross-sectional view 1000 corresponding to some embodiments of act 1510.

At act 1512, an interconnect structure is formed over the transfer gate structure and the readout gate structure. FIG. 11 illustrates a cross-sectional view 1100 corresponding to some embodiments of act 1512.

At act 1514, a thinning process is performed on a back side surface of the substrate, thereby exposing the photodetector. FIG. 12 illustrates a cross-sectional view 1200 corresponding to some embodiments of act 1514.

At act 1516, a deep trench isolation (DTI) structure is formed in the back side surface of the substrate. FIG. 13 illustrates a cross-sectional view 1300 corresponding to some embodiments of act 1516.

At act 1518, an anti-reflection layer is formed on the photodetector, a color filter is formed on the anti-reflection layer, and a lens is formed on the color filter. FIG. 14 illustrates a cross-sectional view 1400 corresponding to some embodiments of act 1518.

Accordingly, in some embodiments, the present application provides a pixel sensor comprising a transfer gate electrode overlying a photodetector and disposed in a substrate. The transfer gate electrode has a top conductive body overlying the substrate and a bottom conductive body extending from the top conductive body to below an adjacent floating diffusion node. A portion of the top conductive body directly overlies the floating diffusion node. A first sidewall of the top conductive body directly overlies the bottom conductive body.

In some embodiments, the present application provides an image sensor including a photodetector disposed in a semiconductor substrate; a floating diffusion node disposed in the semiconductor substrate and above the photodetector; and a transfer gate electrode overlying the photodetector, wherein the transfer gate electrode has a top conductive body overlying a top surface of the semiconductor substrate and a bottom conductive body extending from the top conductive body to below the floating diffusion node, wherein a portion of the top conductive body directly overlies the floating diffusion node, and wherein a first sidewall of the top conductive body directly overlies the bottom conductive body.

In some embodiments, the present application provides a pixel sensor including a photodetector disposed in a semiconductor substrate; a floating diffusion node disposed in the semiconductor substrate, wherein a bottom surface of the floating diffusion node is above a top surface of the photodetector; a conductive contact overlying the floating diffusion node, and a vertical transistor overlying the photodetector and abutting the floating diffusion node, wherein the vertical transistor comprises a vertical gate electrode overlying a vertical gate dielectric, wherein the vertical gate electrode has an upper conductive structure elevated relative to a top surface of the floating diffusion node, and further has a lower conductive structure extending from even with the top surface of the floating diffusion node to a location recessed relative to the bottom surface of the floating diffusion node, wherein at least a portion of the upper conductive structure directly overlies the floating diffusion node, and wherein a first shortest minimum distance between the upper conductive structure and the conductive contact is greater than a second shortest minimum distance between the lower conductive structure and the conductive contact.

In some embodiments, the present application provides a method for forming a pixel sensor, the method includes forming a photodetector in a substrate; performing a first patterning process on the substrate, thereby defining a gate electrode opening in the substrate directly above the photodetector; forming a gate dielectric layer over the substrate and a gate electrode layer over the gate dielectric layer, wherein the gate dielectric layer lines a portion of the gate electrode opening and the gate electrode layer fills a remaining portion of the gate electrode opening; performing a second patterning process on the gate electrode layer and the gate dielectric layer, thereby defining a vertical gate electrode having a top conductive body overlying a top surface of the substrate and a bottom conductive body extending from the top conductive body to a point below the top surface of the substrate, wherein a first sidewall of the top conductive body has an inner segment directly overlying the bottom conductive body; and forming a floating diffusion node in the substrate along a sidewall of the gate dielectric layer, wherein outer segments of the first sidewall of the top conductive body directly overlie the floating diffusion node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a pixel sensor, the method comprising:
    forming a photodetector in a substrate;
    patterning the substrate to define an opening above the photodetector;
    forming a gate electrode within the opening, wherein the gate electrode has a top conductive body overlying a bottom conductive body, wherein a first segment of a sidewall of the top conductive body contacts the bottom conductive body, wherein when viewed from above the top conductive body is laterally offset from a first area of a top surface of the bottom conductive body, wherein an area of a top surface of the top conductive body is greater than the first area; and
    forming a floating diffusion node in the substrate laterally adjacent to the gate electrode, wherein a second segment of the sidewall of the top conductive body overlies the floating diffusion node.

2. The method of claim 1, wherein the second segment of the sidewall is laterally offset from the bottom conductive body.

3. The method of claim 1, further comprising:
    forming a gate dielectric layer within the opening such that the gate dielectric layer is disposed between the substrate and the gate electrode.

4. The method of claim 1, wherein a length of the first segment of the sidewall is greater than a length of the second segment of the sidewall.

5. The method of claim 1, further comprising:
    forming a sidewall spacer around the top conductive body, wherein the sidewall spacer directly contacts the top surface of the bottom conductive body.

6. The method of claim 1, wherein before forming the gate electrode a lower gate implant region is formed within the substrate and laterally surrounds the opening, wherein the lower gate implant region has a first doping type opposite a second doping type of the floating diffusion node.

7. The method of claim 6, wherein a bottom surface of the floating diffusion node abuts an upper surface of the lower gate implant region.

8. A method for forming a pixel sensor, the method comprising:
    forming a photodetector in a substrate;
    performing a first patterning process on the substrate, thereby defining a gate electrode opening in the substrate directly above the photodetector;
    forming a gate dielectric layer over the substrate and a gate electrode layer over the gate dielectric layer, wherein the gate dielectric layer lines a portion of the gate electrode opening and the gate electrode layer fills a remaining portion of the gate electrode opening;
    performing a second patterning process on the gate electrode layer and the gate dielectric layer, thereby defining a vertical gate electrode having a top conductive body overlying a top surface of the substrate and a bottom conductive body extending from the top conductive body to a point below the top surface of the substrate, wherein a first sidewall of the top conductive body has an inner segment overlying the bottom conductive body;
    forming a floating diffusion node in the substrate along a sidewall of the gate dielectric layer, wherein outer segments of the first sidewall of the top conductive body overlie the floating diffusion node and are spaced on opposing sides of the inner segment; and
    forming a conductive contact over the floating diffusion node, wherein the inner and outer segments of the first sidewall face a first direction towards the conductive contact.

9. The method of claim 8, further comprising:
    forming a sidewall spacer around outer sidewalls of the top conductive body, wherein the sidewall spacer continuously extends from the outer segments of the first sidewall to the inner segment of the first sidewall.

10. The method of claim 8, wherein the second patterning process includes performing an etch process into the gate electrode layer, after performing the etch process the bottom conductive body has two discrete heights, wherein a top surface of the bottom conductive body is substantially aligned with the top surface of the substrate and an upper surface of the bottom conductive body is vertically below the top surface of the substrate.

11. The method of claim 8, wherein before forming the gate dielectric layer an isolation structure is formed along opposing sidewalls of the substrate, wherein the opposing sidewalls define the gate electrode opening, wherein the isolation structure comprises a first doping type opposite a second doping type of the floating diffusion node.

12. The method of claim 11, wherein the floating diffusion node abuts a sidewall and a bottom surface of the isolation structure.

13. The method of claim 11, wherein before forming the gate dielectric layer a lower gate implant region is formed within the substrate along the opposing sidewalls of the substrate, wherein the lower gate implant region comprises the first doping type.

14. The method of claim 13, wherein the isolation structure has a higher doping concentration than the lower gate implant region.

15. The method of claim 8, wherein the first sidewall of the top conductive body is substantially straight.

16. A method for forming a pixel sensor, the method comprising:
    forming a photodetector in a substrate, wherein the substrate has a front-side surface opposite a back-side surface;
    forming an isolation element within the substrate;
    forming a gate electrode having a top conductive body overlying a bottom conductive body that extends into the front-side surface of the substrate, wherein the top conductive body is laterally offset from a peripheral region of the bottom conductive body in a direction away from an outer edge of the bottom conductive body;

forming a floating diffusion node in the substrate adjacent to the peripheral region of the bottom conductive body; and wherein the isolation element is disposed between the outer edge of the bottom conductive body and the floating diffusion node, wherein the isolation element is formed before forming the gate electrode, wherein the isolation element is adjacent to and extends along a sidewall of the bottom conductive body.

17. The method of claim 16, wherein the isolation element is formed by an ion implantation process.

18. The method of claim 16, wherein the isolation element comprises a first doping type opposite a second doping type of the floating diffusion node.

19. The method of claim 16, further comprising:

forming a conductive contact over the floating diffusion node, wherein the isolation element is arranged between the conductive contact and the top conductive body.

20. The method of claim 16, further comprising:

forming a deep trench isolation (DTI) structure extending into the back-side surface of the substrate, wherein the bottom conductive body is spaced between inner sidewalls of the DTI structure; and forming a color filter along the back-side surface of the substrate.

\* \* \* \* \*